United States Patent
Cho

(10) Patent No.: US 12,426,490 B2
(45) Date of Patent: Sep. 23, 2025

(54) ELECTRONIC DEVICE INCLUDING DISPLAY

(71) Applicant: Samsung Electronics Co., Ltd., Suwon-si (KR)

(72) Inventor: Joungmin Cho, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 513 days.

(21) Appl. No.: 17/940,801

(22) Filed: Sep. 8, 2022

(65) Prior Publication Data

US 2023/0006006 A1 Jan. 5, 2023

Related U.S. Application Data

(63) Continuation of application No. PCT/KR2021/015709, filed on Nov. 2, 2021.

(30) Foreign Application Priority Data

Nov. 6, 2020 (KR) .................. 10-2020-0147966
Jan. 12, 2021 (KR) .................. 10-2021-0004209

(51) Int. Cl.
*H10K 77/10* (2023.01)
*H10K 50/86* (2023.01)
(Continued)

(52) U.S. Cl.
CPC ........... *H10K 77/111* (2023.02); *H10K 50/86* (2023.02); *H10K 59/872* (2023.02); *H10K 59/65* (2023.02);
(Continued)

(58) Field of Classification Search
CPC .... H10K 77/111; H10K 50/86; H10K 59/872; H10K 59/65; H10K 59/8791;
(Continued)

(56) References Cited

U.S. PATENT DOCUMENTS 8,947,627 B2  2/2015 Rappoport et al.
12,058,916 B1* 8/2024 Cui .................... G02B 27/4205
(Continued)

FOREIGN PATENT DOCUMENTS

CN      209267639       8/2019
JP      2011-248133    12/2011
(Continued)

OTHER PUBLICATIONS

International Search Report for PCT/KR2021/015709 dated Feb. 21, 2022, 5 pages.
(Continued)

*Primary Examiner* — J. E. Schoenholtz
(74) *Attorney, Agent, or Firm* — Nixon & Vanderhye, P.C.

(57) ABSTRACT

According to various embodiments of the disclosure, an electronic device may include: a housing, a display viewable to the outside of the electronic device, wherein the display includes a plurality of layers at least one of which includes an opening area, an optical sensor at least a portion of which is disposed in the opening area, and a printed pattern disposed to correspond to the opening area and having a ring shape, wherein the printed pattern may be disposed on a top surface or a bottom surface of a first layer that does not include the opening area among the plurality of layers, and wherein a portion of the ring shape may have a first height, and a remaining portion of the ring shape may have a second height higher than the first height.

20 Claims, 16 Drawing Sheets

(51) Int. Cl.
*H10K 59/65* (2023.01)
*H10K 59/80* (2023.01)
*H10K 102/00* (2023.01)

(52) U.S. Cl.
CPC .... *H10K 59/8791* (2023.02); *H10K 2102/311* (2023.02)

(58) Field of Classification Search
CPC ....... H10K 2102/311; C09J 9/00; G02B 1/14; G02B 5/30; G06F 1/16; H04M 1/02
See application file for complete search history.

(56) References Cited

U.S. PATENT DOCUMENTS

| | | | |
|---|---|---|---|
| 2013/0271679 | A1 | 10/2013 | Sakamoto et al. |
| 2017/0061836 | A1 | 3/2017 | Kim et al. |
| 2017/0187934 | A1 | 6/2017 | Kwak et al. |
| 2017/0289324 | A1 | 10/2017 | Yeo et al. |
| 2018/0126704 | A1 | 5/2018 | Zhang et al. |
| 2019/0245958 | A1 | 8/2019 | Cheng |
| 2019/0331960 | A1 | 10/2019 | Li et al. |
| 2020/0064681 | A1 | 2/2020 | Son et al. |
| 2020/0310494 | A1 | 10/2020 | Ahn et al. |
| 2020/0328375 | A1 | 10/2020 | Won |
| 2021/0274029 | A1 | 9/2021 | Lin et al. |
| 2022/0020957 | A1 | 1/2022 | Choi |
| 2022/0190043 | A1* | 6/2022 | Ge .................. H10K 50/865 |
| 2022/0246884 | A1* | 8/2022 | Yan .................. H10K 50/844 |

FOREIGN PATENT DOCUMENTS

| | | |
|---|---|---|
| JP | 2014-057271 | 3/2014 |
| KR | 10-1257939 | 4/2013 |
| KR | 2013-0128417 | 11/2013 |
| KR | 10-2017-0077360 | 7/2017 |
| KR | 10-2017-0112790 | 10/2017 |
| KR | 10-2020-0023763 | 3/2020 |
| KR | 10-2020-0063188 | 6/2020 |
| KR | 10-2020-0100238 | 8/2020 |
| KR | 10-2020-0114164 | 10/2020 |
| KR | 10-2020-0120845 | 10/2020 |
| KR | 10-2212879 | 2/2021 |
| KR | 10-2021-0029618 | 3/2021 |
| KR | 10-2021-0046737 | 4/2021 |
| WO | 2014/088469 | 6/2014 |
| WO | 2020/204553 | 10/2020 |
| WO | 2021/027506 | 2/2021 |

OTHER PUBLICATIONS

Office Action dated May 12, 2025 in Korean Application No. 10-2020-0004209 and English-language translation.

* cited by examiner

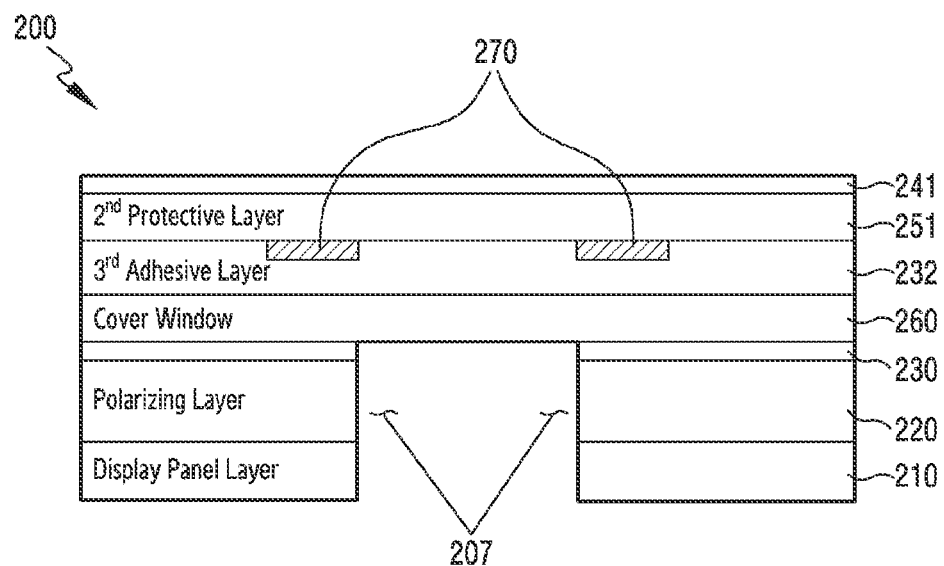
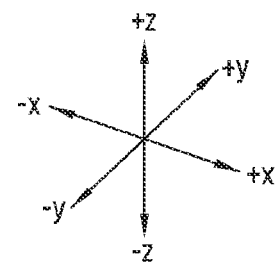
FIG.2C

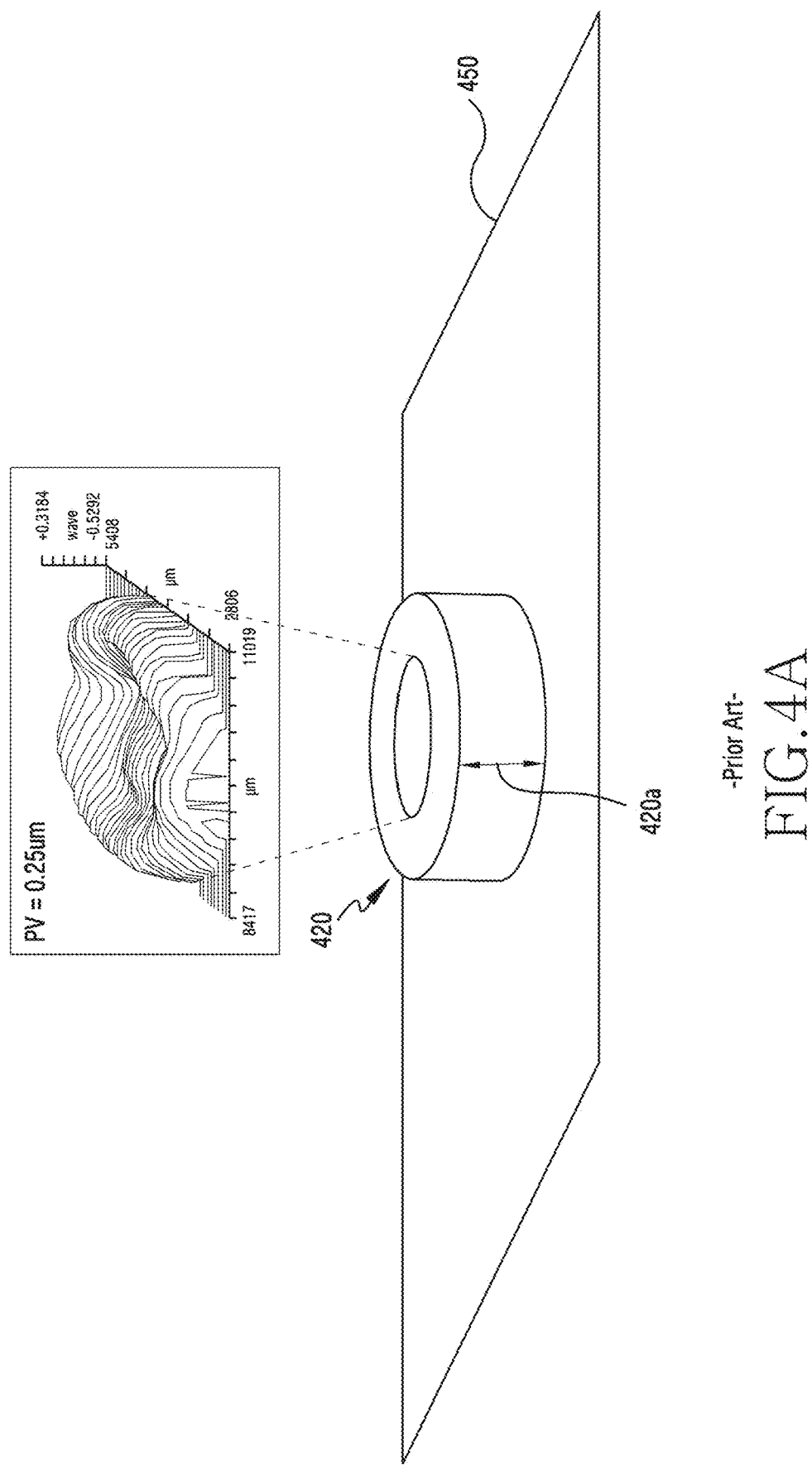
FIG. 4A -Prior Art-

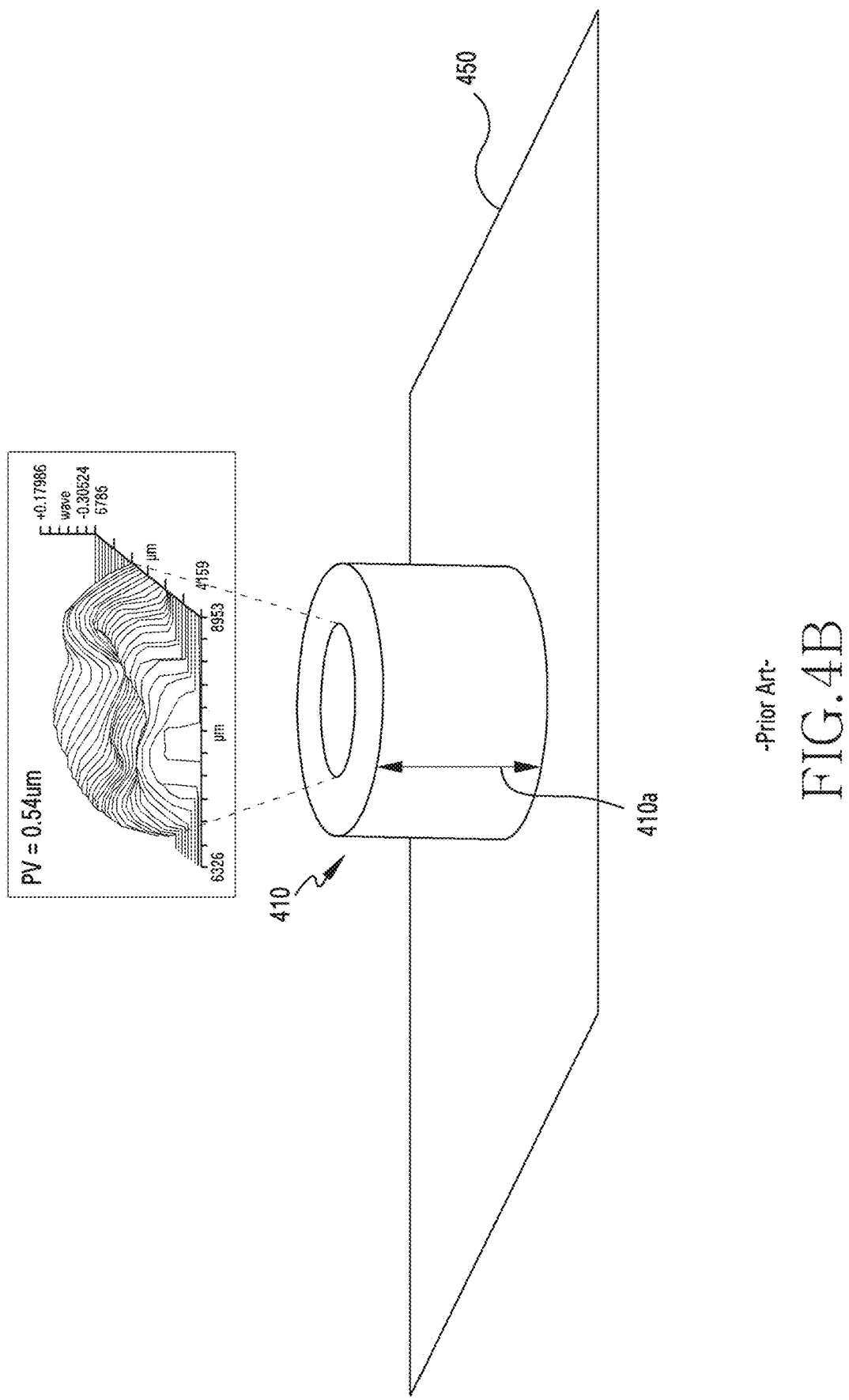
FIG. 4B -Prior Art-

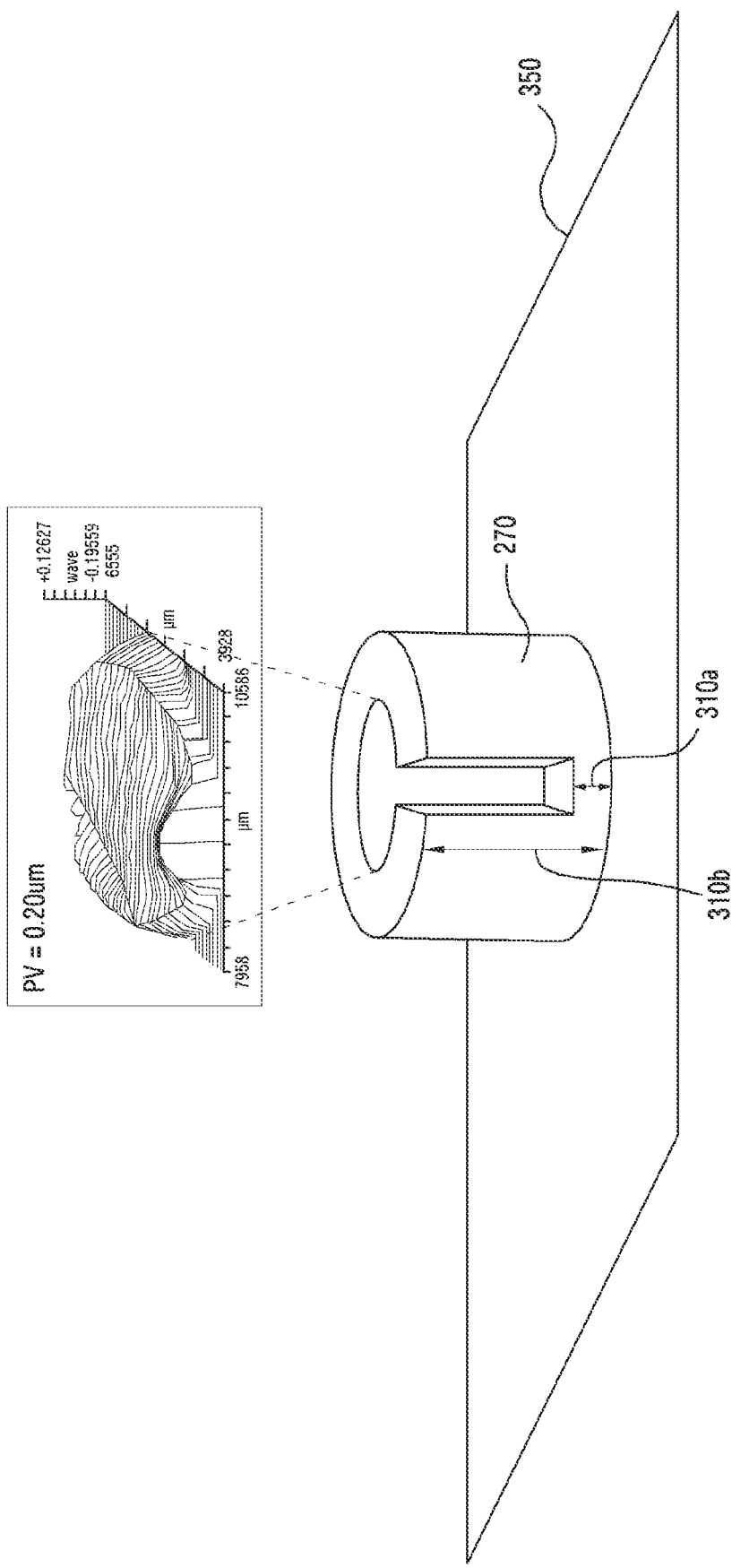

ELECTRONIC DEVICE INCLUDING DISPLAY

CROSS-REFERENCE TO RELATED APPLICATIONS

This application is a continuation of International Application No. PCT/KR2021/015709 designating the United States, filed on Nov. 2, 2021, in the Korean Intellectual Property Receiving Office and claiming priority to Korean Patent Application No. 10-2020-0147966, filed on Nov. 6, 2020, in the Korean Intellectual Property Office and Korean Patent Application No. 10-2021-0004209, filed on Jan. 12, 2021, in the Korean Intellectual Property Office, the disclosures of all of which are incorporated by reference herein in their entireties.

BACKGROUND

Field

The disclosure relates to an electronic device including a display.

Description of Related Art

Electronic devices are released in various sizes according to their functions and user preferences, and technical research is being carried out to relatively increase the area of a display that displays a screen on the front surface (front side) of an electronic device in order to secure wide visibility and convenience of operation even if the electronic device has a fixed size. As the area of the display in the electronic device is relatively increased, a camera module or a sensor module disposed near an edge or an upper corner of the front surface of the electronic device may be disposed in a portion of a hole provided in the display. When an optical sensor (e.g., a camera module or a sensor module) disposed in the hole of the display is affected by light exposed by the display, the camera module or the sensor module may not function normally. In addition, a flare phenomenon may occur in the camera lens due to light incident through the periphery (edge) of the hole. In addition, it is necessary to prevent a boundary between the optical sensor disposed in the hole of the display and a plurality of panels disposed in the display from being visible. Therefore, in order to block the light exposed by the display, to prevent a flare phenomenon caused by external light, and to improve the aesthetics of the electronic device, a printed pattern (e.g., a black matrix (BM)) may be disposed on one surface of a plurality of layers of the display.

In addition, the display may include a cover window for protecting the plurality of layers of the display. A bar-type display adopts tempered glass as a protective window. However, since the cover window of a flexible display requires flexibility, it is difficult to use non-flexible tempered glass as a material for the cover window of the flexible display. Therefore, research on the cover window of a flexible display is being carried out, and polyimide (PI) or ultra-thin glass (UTG) that is flexible while maintaining the existing tempered glass characteristic has been adopted as the cover window of a flexible display.

In addition, in a flexible display including a cover window of, for example, polyimide or UTG, an adhesive having a flexible property (e.g., a pressure-sensitive adhesive (PSA) or an optical clear adhesive (OCA)) may be disposed between a plurality of respective layers.

In the flexible display, a protective layer may be disposed above or above and below the cover window in order to protect the cover window of, for example, PI or UTG, and a printed pattern may be disposed on one surface of the protective layer.

Due to the printed pattern disposed on one surface of the protective layer, a step as high as the height of the printed pattern may occur on the flexible display. The step occurring due to the printed pattern may cause a decrease in flatness (e.g., a value indicating flatness) of the flexible display, deformation of at least a portion of the flexible display, or deformation of the adhesive. As a result, when a camera function is executed by the user using the camera module or the sensor module disposed in a portion of the hole of the flexible display, local image quality deterioration may occur.

SUMMARY

Embodiments of the disclosure provide an electronic device including a display wherein it is possible to prevent and/or reduce image quality from being deteriorated by a decrease in flatness of a display due to a printed pattern.

According to various example embodiments of the disclosure, an electronic device may include: a housing, a display visible to the outside of the electronic device, wherein the display includes a plurality of layers at least one of which includes an opening area, an optical sensor at least a portion of which is disposed in the opening area, and a printed pattern disposed to correspond to the opening area and having a ring shape, wherein the printed pattern may be disposed on a top surface or a bottom surface of a first layer that does not include the opening area among the plurality of layers, and wherein a portion of the ring shape may have a first height, and a remaining portion of the ring shape may have a second height higher than the first height.

According to various example embodiments of the disclosure, a display device may include: a layer structure including a plurality of layers, wherein at least one of the plurality of layers includes an opening area, an optical sensor disposed in at least a portion of the opening area, and a printed pattern disposed to correspond to the opening area and having a ring shape, wherein the printed pattern may be disposed on a top surface or a bottom surface of a first layer that does not include the opening area among the plurality of layers, and wherein a portion of the ring shape may have a first height, and a remaining portion of the ring shape may have a second height higher than the first height.

According to various example embodiments, an image and/or a moving picture acquired using the camera module or the sensor module disposed in a portion of the opening area provided in the display can be made to have a uniform resolution as a whole without being deteriorated in image quality.

According to various example embodiments, by arranging the printed pattern on one surface of the plurality of layers of the display, it is possible to prevent and/or reduce the flatness of the display from being deteriorated while achieving an effect of improving the aesthetics.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 2C is a cross-sectional view of a display including a printed pattern taken along line A-A' in FIG. 1A according to various embodiments;

FIG. 4A is a diagram illustrating flatness measurement data values of a display including a printed pattern having a first height according to various embodiments;

FIG. 4B is a diagram illustrating flatness measurement data values of a display including a printed pattern having a second height according to various embodiments;

FIG. 4C is a diagram illustrating flatness measurement data values of a display including the printed pattern of FIG. 3 according to various embodiments;

DETAILED DESCRIPTION

Hereinafter, various example embodiments of the disclosure will be described with reference to the accompanying drawings. However, it shall be understood that it is not intended to limit the disclosure to specific embodiments, and that the disclosure includes various modifications, equivalents, or alternatives of the embodiments of the disclosure.

Figure 1A:
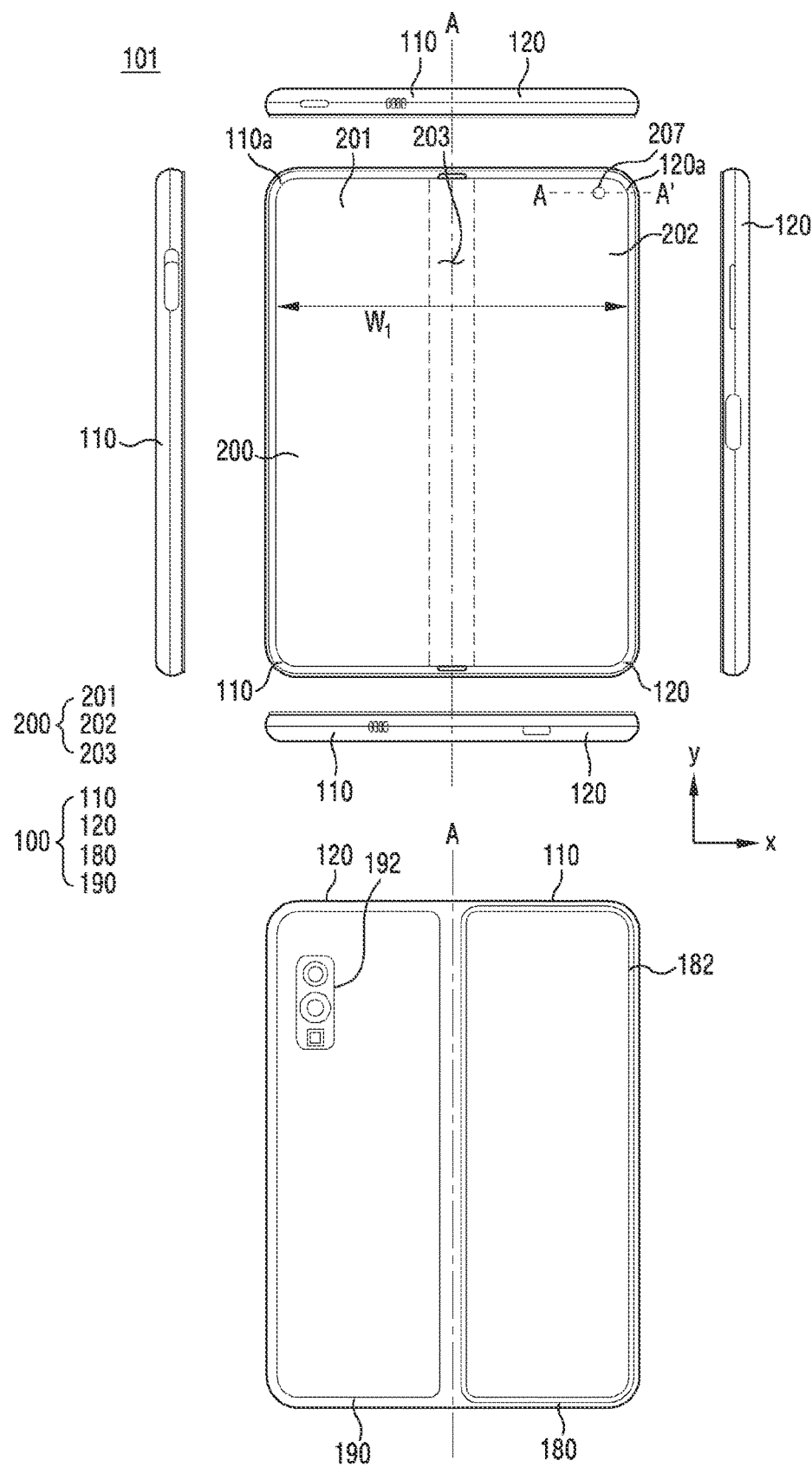
FIG. 1A is a diagram illustrating an electronic device in an unfolded state according to various embodiments.
Figure 1B:
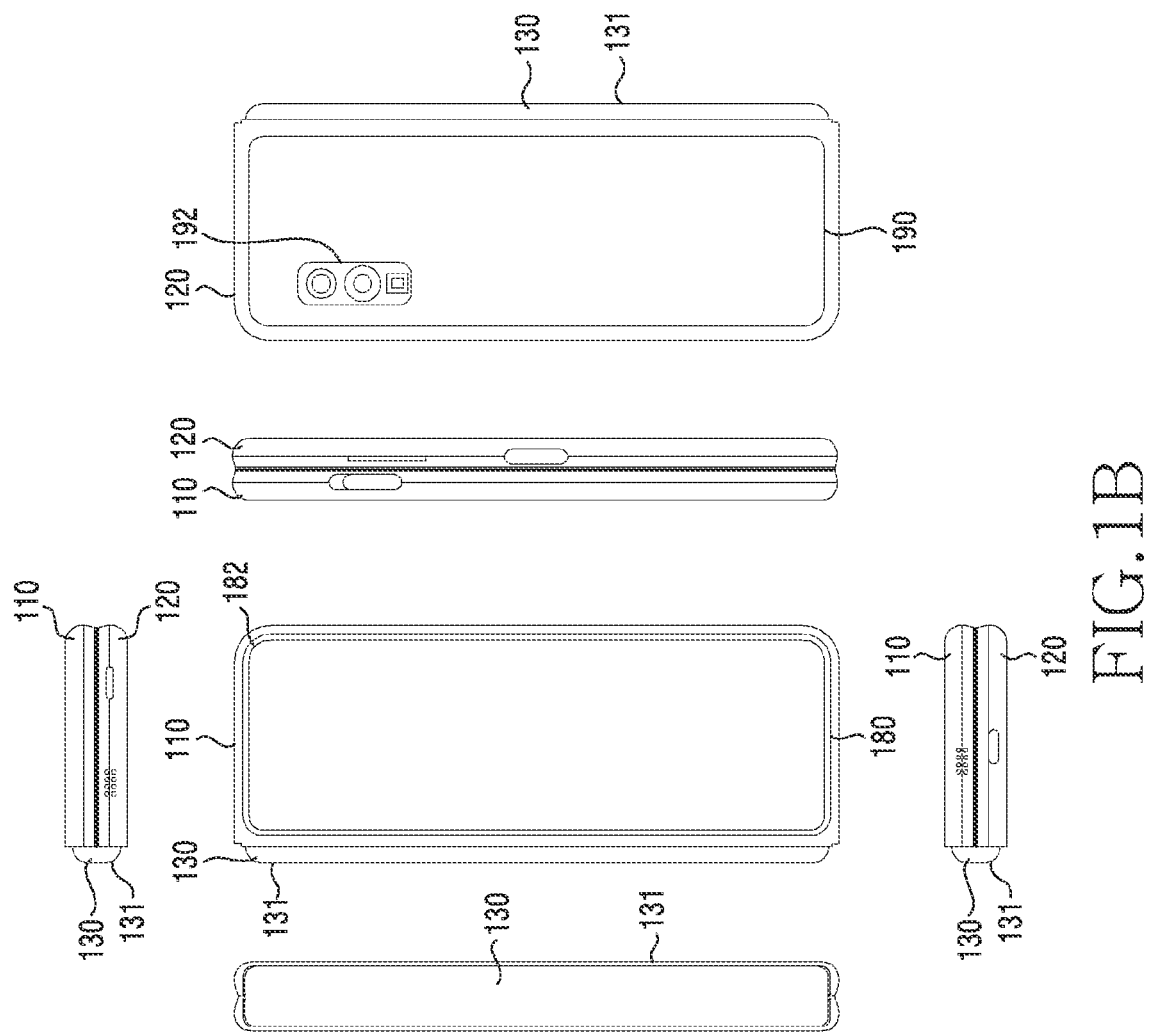
FIG. 1B is a diagram illustrating the electronic device in a folded state according to various embodiments.

FIG. 1A is a diagram illustrating an example electronic device 101 in an unfolded state according to various embodiments. FIG. 1B is a diagram illustrating the electronic device 101 in a folded state according to various embodiments.

Referring to FIGS. 1A and 1B, in an embodiment, the electronic device 101 may include a foldable housing 100, a hinge structure (e.g., including a hinge) 130, a hinge cover 131 configured to define the outer surface of the hinge structure 130 and to cover a foldable portion of the foldable housing 100, and a flexible or foldable display 200 (hereinafter, simply referred to as a "display 200") disposed in a space defined by the foldable housing 100. In an embodiment, the surface on which the display 200 is disposed (or the surface on which the display 200 is visible from the outside of the electronic device 101) may be defined as the front surface of the electronic device 101. In addition, the surface opposite to the front surface may be defined as the rear surface of the electronic device 101. Furthermore, the surface surrounding the space between the front surface and the rear surface may be defined as a side surface of the electronic device 101.

In an embodiment, the foldable housing 100 may include a first housing 110, a second housing 120, a first rear cover 180, a second rear cover 190, and a hinge structure 130. The foldable housing 100 of the electronic device 101 is not limited to the shape and assembly illustrated in FIGS. 1A and 1B, and may be implemented by a combination and/or an assembly of different shapes or components. For example, the first housing 110 and the first rear cover 180 may be integrally configured, and the second housing 120 and the second rear cover 190 may be integrally configured.

In an embodiment, the first housing 110 is connected to the hinge structure 130 and may include a first surface (e.g., the first surface 111 in FIG. 1C to be described later) and oriented in a first direction and a second surface (e.g., the second surface 112 in FIG. 1C to be described later) oriented in a second direction opposite to the first direction. The second housing 120 is connected to the hinge structure 130 and may include a third surface (e.g., the third surface 121 in FIG. 1C to be described later) oriented in a third direction and a fourth surface (e.g., the fourth surface 122 of FIG. 1C to be described later) oriented in a fourth direction opposite to the third direction. The second housing 120 is rotatable about the hinge structure 130 (or a pivot axis A) relative to the first housing 110. The electronic device 101 may be variable to the folded state or the unfolded state.

In an embodiment, the first housing 110 and the second housing 120 are disposed on opposite sides about the pivot axis A, and the first housing 110 and the second housing 120 may have generally symmetrical shapes with respect to the pivot axis A in the state in which the foldable housings 100 is unfolded. As will be described later, the first housing 110 and the second housing 120 may have different angles or distances therebetween depending on whether the electronic device 101 is in the unfolded state, in the folded state, or in a partially unfolded intermediate state. According to the embodiment illustrated in FIGS. 1A and 1B, the second housing 120 may have a shape symmetrical to that of the first housing 110. However, the first housing 110 and the second housing 120 may have asymmetric shapes. For example, the screen display area of the first housing 110 may be wider than that of the second housing 120. For example, FIGS. 1A and 1B illustrate that the hinge structure 130 is provided in the central area and the first housing 110 and the second housing 120 are folded in symmetrical shapes about the hinge structure 130. However, unlike this, the hinge structure 130 may be provided in an area other than the central area of the first housing 110, and the second housing 120 may be larger than the first housing 110.

In an embodiment, as illustrated in FIG. 1A, the first housing 110 and the second housing 120 may define together a recess that accommodates the display 200 therein.

In an embodiment, the recess may have a first width w1 between a first portion 110a of the first housing 110 parallel to the pivot axis A and a second portion 120a of the second housing 120 parallel to the pivot axis A.

In an embodiment, at least a portion of the first housing 110 and at least a portion of the second housing 120 may be made of a metal material or a non-metal material having rigidity of a level selected in order to support the display 200. The at least a portion made of the metal material may provide a ground plane of the electronic device 101, and may be electrically connected to a ground line provided on a printed circuit board (e.g., the board unit 150 in FIG. 1C).

In an example, the at least a portion of the first housing 110 and the second housing 120 made of the metal material may be used as a radiator of an antenna.

In an embodiment, the first rear cover 180 may be disposed at one side of the pivot axis A on the rear surface of the electronic device 101, and may have, for example, a substantially rectangular periphery, which may be surrounded by the first housing 110. Similarly, the second rear cover 190 may be disposed at the other side of the pivot axis A on the rear surface of the electronic device 101, and the periphery may be surrounded by the second housing 120.

In an embodiment, the first rear cover 180 and the second rear cover 190 may have substantially symmetrical shapes about the pivot axis A. However, the first rear cover 180 and the second rear cover 190 do not necessarily have mutually symmetrical shapes. In another example, the first rear cover 180 may be integrally configured with the first housing 110, and the second rear cover 190 may be integrally configured with the second housing 120.

In an embodiment, the first housing 110, the second housing 120, the first rear cover 180, and the second rear cover 190 may define a space in which various components (e.g., a printed circuit or a battery) of the electronic device 101.

In an embodiment, one or more components may be disposed or visually exposed on the rear surface of the electronic device 101. For example, at least a portion of a sub-display may be visually exposed through a first rear area 182 of the first rear cover 180. In an embodiment, one or more components or sensors may be visually exposed through a second rear area 192 of the second rear cover 190. In an embodiment, the sensors may include a proximity sensor and/or a rear camera.

According to an embodiment, a front camera, which is exposed to the front surface of the electronic device 101 through the one or more openings provided in an opening area 207 of the display 200 or a rear camera exposed through the second rear area 192 of the second rear cover 190, may include one or more lenses, an image sensor, and/or an image signal processor. The flash may include, for example, a light-emitting diode or a xenon lamp. In various embodiments, two or more lenses (e.g., an infrared camera lens, a wide-angle lens, and a telephoto lens) and image sensors may be disposed on one surface of the electronic device 101.

Referring to FIG. 1B, the hinge cover 131 is disposed between the first housing 110 and the second housing 120, and may include an internal component (e.g., the hinge structure 130). In an example, the hinge cover 131 may be covered by a portion of the first housing 110 and a portion of the second housing 120, or may be exposed to the outside depending on the state of the electronic device 101 (the unfolded state, the intermediate state, or the folded state).

According to an embodiment, as illustrated in FIG. 1A, when the electronic device 101 is in the unfolded state, the hinge cover 131 may not be exposed by being covered by the first housing 110 and the second housing 120. As another example, as illustrated in FIG. 1B, when the electronic device 101 is in the folded state (e.g., the fully folded state), the hinge cover 131 may be exposed to the outside between the first housing 110 and the second housing 120. In another example, when the first housing 110 and the second housing 120 are in the intermediate state in which the first housing 110 and the second housing 120 are folded to form a predetermined angle therebetween, a portion of the hinge cover 131 may be exposed to the outside between the first housing 310 and the second housing 320. In this case, however, the exposed area may be smaller than that in the fully folded state. In an example, the hinge cover 131 may include a curved surface.

In an embodiment, the display 200 may be disposed in a space defined by the foldable housing 100. For example, the display 200 may be seated in the recess defined by the foldable housing 100, and may include most of the front surface of the electronic device 101. Accordingly, the front surface of the electronic device 101 may include the display 200, and partial areas of the first housing 110 and the second housing 120, which are adjacent to the display 200. The rear surface of the electronic device 101 may include the first rear cover 180, a partial area of the first housing 110 adjacent to the first rear cover 180, the second rear cover 190, and a partial area of the second housing 120 adjacent to the second rear cover 190.

In an embodiment, the display 200 may be a display in which at least one area is deformable into a planar surface or a curved surface. In an example, the display 200 may include a first area 201 disposed on one side of the folding area 203 (e.g., the left side of the folding area 203 illustrated in FIG. 1A), and a second area 202 disposed on the other side of the folding area 203 (e.g., the right side of the folding area 203 illustrated in FIG. 1A). However, the area division of the display 200 illustrated in FIG. 1A is an example, and the display 200 may be divided into multiple areas (e.g., four or more areas, or two areas) depending on the structure or functions thereof. For example, in the embodiment illustrated in FIG. 1A, the area of the display 200 may be divided by the folding area 203 or the pivot axis A extending parallel to the y axis. However, in an embodiment, the area of the display 200 may be divided with reference to another folding area (e.g., a folding area parallel to the x axis) or another pivot axis (e.g., a pivot axis parallel to the x axis). In an embodiment (not illustrated), the display 200 may be coupled to or disposed adjacent to a touch-sensitive circuit, a pressure sensor capable of measuring a touch intensity (pressure), and/or a digitizer configured to detect a magnetic-field-type stylus pen.

In an embodiment, the first area 201 and the second area 202 may have generally symmetrical shapes about the folding area 203. However, unlike the first area 201, the second area 202 may include a notch or a hole cut due to the presence of the opening area 207, but may have a shape symmetrical to the first area 201 in the other area. In other words, the first area 201 and the second area 202 may include portions having mutually symmetrical shapes and portions having mutually asymmetrical shapes.

Hereinafter, the operations of the first housing 110 and the second housing 120 according to the state of the electronic device 101 (e.g., the folded state, the unfolded state, or the intermediate state) and respective areas of the display 200 will be described.

In an embodiment, when the electronic device 101 is in the unfolded state (e.g., FIG. 1A), the first housing 110 and the second housing 120 may be disposed to form an angle of 180 degrees therebetween and to face the same direction. The surface of the first area 201 and the surface of the second area 202 of the display 200 form 180 degrees relative to each other, and may be face the same direction (e.g., the front direction of the electronic device 101). The folding area 203 may form the same plane as the first area 201 and the second area 202.

In an embodiment, when the electronic device 101 is in the folded state (e.g., FIG. 1B), the first housing 110 and second housing 120 may be disposed to face each other. The surface of the first area 201 and the surface of the second area 202 of the display 200 may face each other while forming a narrow angle (e.g., an angle between 0 and 10 degrees) relative to each other. At least a portion of the folding area 203 may be configured as a curved surface having a predetermined curvature.

In an embodiment, when the electronic device 101 is in the intermediate state, the first housing 110 and the second housing 120 may be disposed at a predetermined angle relative to each other. The surface of the first area 201 and the surface of the second area 202 of the display 200 may form an angle larger than that in the folded state and smaller than that in the unfolded state. At least a portion of the folding area 203 may configured as a curved surface having a predetermined curvature, and the curvature in this case may be smaller than that in the folded state.

According to the embodiment illustrated in FIG. 1B, the electronic device 101 is illustrated in an in-folded state in which the first surface (e.g., the first surface 111 in FIG. 1C to be described later) of the first housing 110 faces the third surface (e.g., the third surface 121 of FIG. 1C to be described later) of the second housing 120.

Unlike the embodiment illustrated in FIG. 1B, by being out-folded, the second surface (e.g., the second surface 112 of FIG. 1C to be described later) of the first housing 110 may face the fourth surface (e.g., the fourth surface 122 in FIG. 1C to be described later) of the second housing 120.

In an embodiment, the electronic device 101 may perform both the in-folded operation and the out-folded operation, or may selectively perform the in-folded operation or the out-folded operation.

Figure 1C:
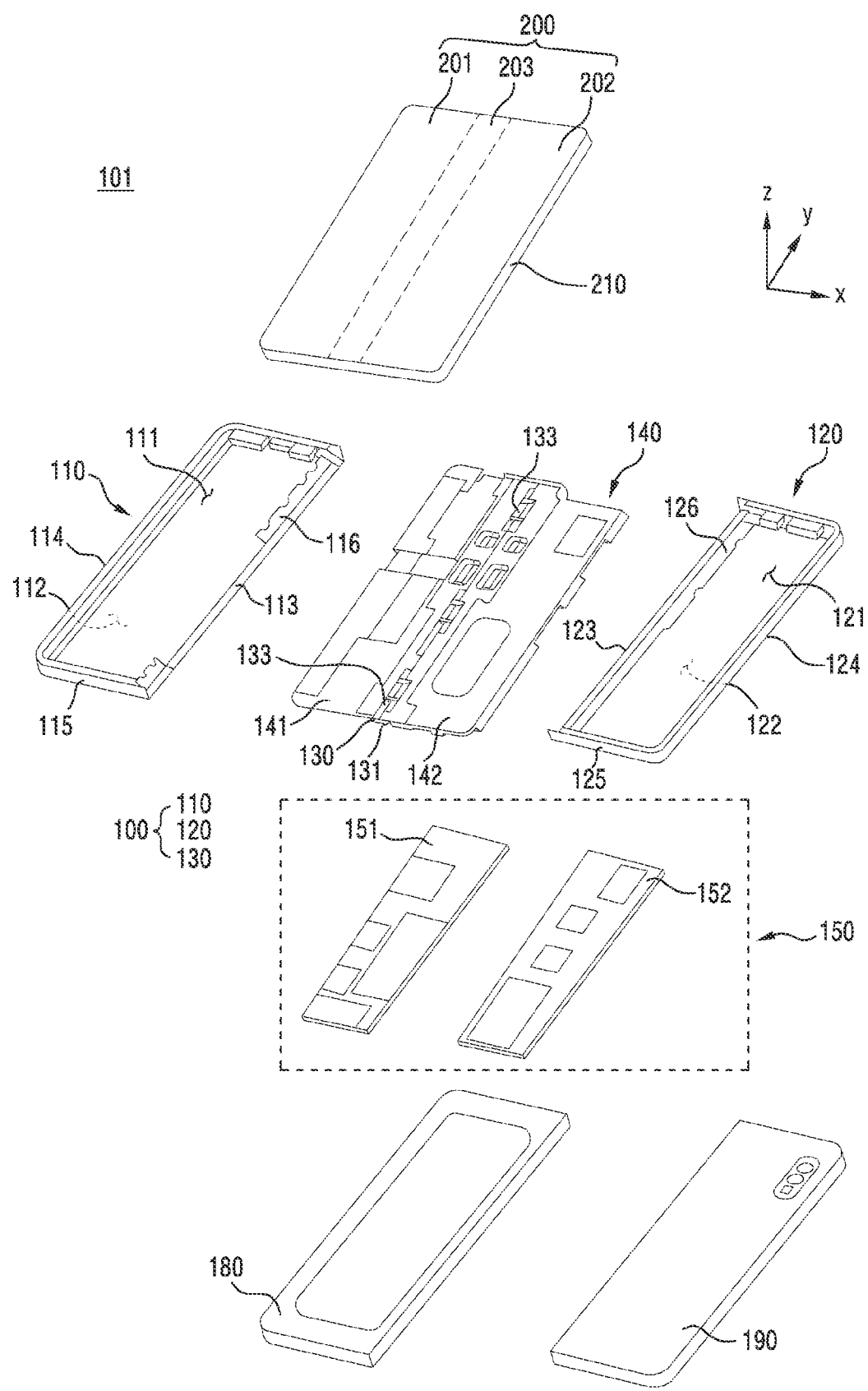
FIG. 1C is an exploded perspective view of the electronic device according to various embodiments.

FIG. 1C is an exploded perspective view of the electronic device 101 according to various embodiments.

Referring to FIG. 1C, in an embodiment, the electronic device 101 may include a foldable housing 100, a display 200, and a board unit 150. The foldable housing 100 may include a first housing 110, a second housing 120, a hinge area 130, a bracket assembly 140, a first rear cover 180, and a second rear cover 190.

In an embodiment, the display 200 may include a display panel layer 210 and one or more plates (e.g., the cover window 260 in FIG. 2A to be described later) seated on the display panel layer 210.

In an embodiment, the bracket assembly 140 may include a first support plate 141 and a second support plate 142. A connection structure 133 is disposed between the first support plate 141 and the second support plate 142 so that a hinge operation can be made freely, and a hinge cover 131 may be disposed to cover the connection structure 133 such that the connection structure 133 is not visible from the outside. In another example, a printed circuit board (e.g., a flexible printed circuit board (FPCB)) may be disposed to extend across the hinge structure 130 and to connect the first support plate 141 and the second support plate 142 to each other.

In an embodiment, the board unit 150 may include a first main circuit board 151 disposed on the first support plate 141 side and a second main circuit board 152 disposed on the second support plate 142 side. The first main circuit board 151 and the second main circuit board 152 may be disposed inside a space defined by the bracket assembly 140, the first housing 110, the second housing 120, the first rear cover 180, and the second rear cover 190. Components for implementing various functions of the electronic device 101 may be mounted on the first main circuit board 151 and the second main circuit board 152.

In an embodiment, the first housing 110 and the second housing 120 may be assembled to be coupled to the opposite sides of the bracket assembly 140 in the state in which the display 200 is coupled to the bracket assembly 140. For example, the first housing 110 and the second housing 120 may be coupled to the bracket assembly 140 by sliding from opposite sides of the bracket assembly 140, respectively.

In an embodiment, the first housing 110 may include a first surface 111 and a second surface 112 facing away from the first surface 111, and the second housing 120 may include a third surface 121 and a fourth surface 122 facing away from the third surface 121.

In an embodiment, the display 200 may be visible from the outside through at least one surface of the foldable housing 100 and may extend on (or above) the first surface 111 of the first housing 110 and on (or above) the third surface 121 of the second housing 120.

In an embodiment, the first housing 110 is connected to the hinge structure 130 and may include a first side surface 113 parallel to the pivot axis (e.g., the pivot axis A in FIG. 1B) of the hinge structure 130, a second side surface 114 facing away from the first side surface 113, and a third side surface 115 perpendicular to the pivot axis A of the hinge structure 130.

In an embodiment, the second housing 120 is connected to the hinge structure 130 and may include a fourth side surface 123 parallel to the pivot axis (e.g., the pivot axis A in FIG. 1B) of the hinge structure 130, a fifth side surface 124 facing away from the first side surface 123, and a sixth side surface 125 perpendicular to the pivot axis A of the hinge structure 130.

In an embodiment, the first housing 110 may include a first rotational support surface 116, and the second housing 120 may include a second rotational support surface 126, which corresponds to the first rotational support surface 116. The first rotational support surface 116 and the second rotational support surface 126 may include curved surfaces corresponding to curved surfaces included in the hinge cover 131.

In an embodiment, when the electronic device 101 is in the unfolded state (e.g., the electronic device 101 in FIG. 1A), the first rotational support surface 116 and the second rotational support surface 126 may cover the hinge cover 131 so that the hinge cover 131 may not be exposed or minimally exposed to the rear surface of the electronic device 101. In another example, when the electronic device 101 is in the folded state (e.g., the electronic device 101 in FIG. 1B), the first rotational support surface 116 and the second rotational support surface 126 may rotate along the curved surface included in the hinge cover 131 so that the hinge cover 131 can be maximally exposed to the rear surface of the electronic device 101.

Figure 2A:
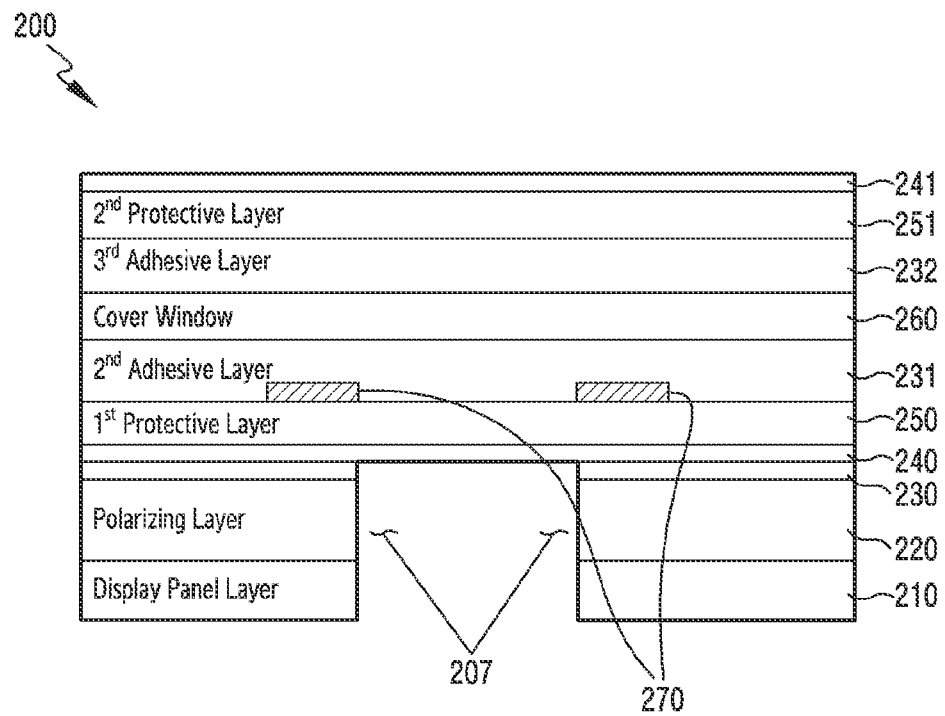
FIG. 2A is a cross-sectional view of a display including a printed pattern taken along line A-A' in FIG. 1A according to various embodiments.

FIG. 2A is a cross-sectional view of a display 200 including a printed pattern 270 taken along line A-A' in FIG. 1A according to various embodiments.

Referring to FIG. 2A, the display 200 may include a plurality of layers. In an embodiment, the plurality of layers of the display 200 may include at least one of a display panel layer 210 configured to display an image, a polarizing layer 220, a first adhesive layer 230, and a second adhesive layer 231, a third adhesive layer 232, a first hard coating layer 240, a second hard coating layer 241, a first protective layer 250, a second protective layer 251, a cover window 260, and/or a printed pattern 270.

In an embodiment, the display panel layer 210 may be a deformable display panel layer. For example, the display panel layer 210 may include a rollable display panel, an extendable display panel, a foldable display panel, a flexible display panel, or the like.

In an embodiment, the display panel layer 210 may include a cover panel configured to protect the display panel layer 210, a base substrate, a thin film transistor (TFT) layer formed on the base substrate, and a pixel layer (or an organic light-emitting layer) to which a signal voltage is applied from the thin film transistor layer. The display panel layer 210 may further include any suitable components, such as a thin film encapsulation (TFE) layer for encapsulating the pixel layer, a back film for supporting the base substrate, and the like. In an embodiment, the base substrate may be made of a polymer material (e.g., polyimide (PI) or the like) to secure the flexibility of the substrate, but is not limited thereto.

In an embodiment, the display panel layer 210 may, for example, be an active-matrix organic light-emitting diode (AMOLED) panel. Since the AMOLED panel is well known in the art, a detailed description thereof will be omitted. Since the AMOLED panel is a so-called self-emitting type display panel in which light is generated from a light-emitting layer by a driving signal, a separate light source (e.g., a backlight) may not be required unlike an LCD panel. Therefore, the AMOLED panel can be manufactured in the form of a flexible film that is very thin compared to an LCD panel.

In an embodiment, the display panel layer 210 may include a touch screen panel. In an example, the touch screen panel may be disposed between the display panel layer 210 and the polarizing layer 220. In an example, the touch screen panel may be disposed on one surface of the polarizing layer 220. According to an input signal detected by the touch screen panel, the display panel layer 210 may provide an image corresponding to the input signal to the user. In an example, the touch screen panel may be a resistive touch panel or a capacitive touch panel.

In an embodiment, the display panel layer 210 may include an opening area 207. A plurality of optical sensors (e.g., a sensor module and/or a camera module) may be disposed in at least one area of the opening area 207.

In an embodiment, the polarizing layer 220 may be disposed on the top surface of the display panel layer 210 (e.g., in the +z direction of FIG. 2A). The polarizing layer 220 may provide directionality to light emitted from the display panel layer 210 (e.g., a pixel layer), thereby improving sharpness of an image displayed through the display panel layer 210. The polarizing layer 220 may prevent and/or reduce glare, a decrease in a contrast ratio, and the like, which are generated due to external light being incident on the display 200 and then reflected. In an example, the polarizing layer 220 may be integrally configured with the display panel layer 210. In an example, the polarizing layer 220 may include an opening area 207.

In an embodiment, the first adhesive layer 230, the second adhesive layer 231, and the third adhesive layer 232 may be made of a transparent adhesive material. In an example, the first adhesive layer 230, the second adhesive layer 231, and the third adhesive layer 232 may include a pressure-sensitive adhesive (PSA), an optically clear adhesive (OCA), and/or a thermally responsive adhesive. In an example, the first adhesive layer 230 may include an opening area 207. In another example, the first adhesive layer 230 may not include the opening area 207.

In an example, the first adhesive layer 230 may be embedded between the polarizing layer 220 and the first hard coating layer 240. The first hard coating layer 240 may be attached to the polarizing layer 220 via the first adhesive layer 230. In an example, the first hard coating layer 240 may be provided using an organic-inorganic hybrid coating agent. Depending on the amount or property of organic and inorganic molecular structural units ($SiO_2$, $Al_2O_3$, etc.) forming the hybrid material, it is possible to secure both hardness and ductility. In an example, the first hard coating layer 240 may serve to protect the polarizing layer 220 and the display panel layer 210 from an external impact. In an example, the first adhesive layer 230 and/or the first hard coating layer 240 may include an opening area 207.

In an embodiment, the first protective layer 250 and the second protective layer 251 may be disposed above and/or below the cover window 260. The first protective layer 250 and the second protective layer 251 may implement at least one of functions of anti-scattering, shock absorption, anti-engraving, anti-finger, and anti-glare of the cover window 260. The first protective layer 250 and the second protective layer 251 may include a transparent polymer film. The transparent polymer film may include at least one of polyethylene terephthalate (PET), polyethylene naphthalate (PEN), polyether sulfone (PES), polyimide (PI), polyarylate (PAR), polycarbonate (PC), polymethyl methacrylate (PMMA), or cycloolefin copolymer (COC) resin In an embodiment, the first protective layer 250 may be disposed on the top surface of the first hard coating layer 240 (e.g., in the +z direction in FIG. 2A). In an example, the first protective layer 250 may be a first layer on which the printed pattern 270 not including the opening area 207 is disposed.

In an embodiment, the printed pattern (e.g., a BM area) 270 may be disposed on the top surface (e.g., +z direction in FIG. 2A) of the first protective layer 250. The printed pattern 270 may be disposed at a position corresponding to the opening area 207. As will be described in greater detail below with reference to FIG. 3, the printed pattern 270 may be disposed to surround the opening area 207. The printed pattern 270 may be a closed curve or a closed figure, such as a ring shape. The printed pattern 270 may have a closed curve shape including an ellipse. The printed pattern 270 blocks the light emitted from the display panel layer 210 so that the optical sensor disposed in at least a portion of the opening area 207 cannot be affected by the light emitted from the display panel layer 210. In addition, the printed pattern 270 may prevent and/or reduce the emitted light from being observed outside.

In an embodiment, the second adhesive layer 231 may be embedded between the first protective layer 250 on which the printed pattern 270 is disposed and the cover window 260. The cover window 260 may be attached to the first protective layer 250 via the second adhesive layer 231.

In an embodiment, the cover window 260 may be disposed on the top surface of the first protective layer 250. In an example, the cover window 260 may be transparent glass or transparent plastic. In an example, the cover window 260 may include at least one of ultra-thin glass (UTG), colorless polyimide (CPI), polyethylene (PET), polyurethane (PU), or cellulose triacetate (TAC). The cover window 260 may serve to protect the polarizing layer 220 and the display panel layer 210 from external influences. In an example, the printed pattern 270 may be disposed on the top surface of the cover window 260 (e.g., in the +z direction of FIG. 2A). The printed pattern 270 may be disposed at a position corresponding to the opening area 207. In an embodiment, the second protective layer 251 may be disposed on the top surface of the cover window 260. In an example, the third adhesive layer 232 may be embedded between the cover window 260 and the second protective layer 251. The second protective layer 251 may be attached to the cover window 260 via the third adhesive layer 232.

In an embodiment, the second hard coating layer 241 may be disposed on the top surface (e.g., the +z direction in FIG. 2A) of the second protective layer 251. In an example, the second hard coating layer 241 may be provided using an organic-inorganic hybrid coating agent. Depending on the amount or property of organic and inorganic molecular structural units ($SiO_2$, $Al_2O_3$, etc.) forming the hybrid material, it is possible to secure both hardness and ductility. In an example, the second protective layer 251 may be an anti-finger (AF) coating, an anti-reflection (AR) coating, and/or an anti-glare (AG) coating.

Figure 2B:
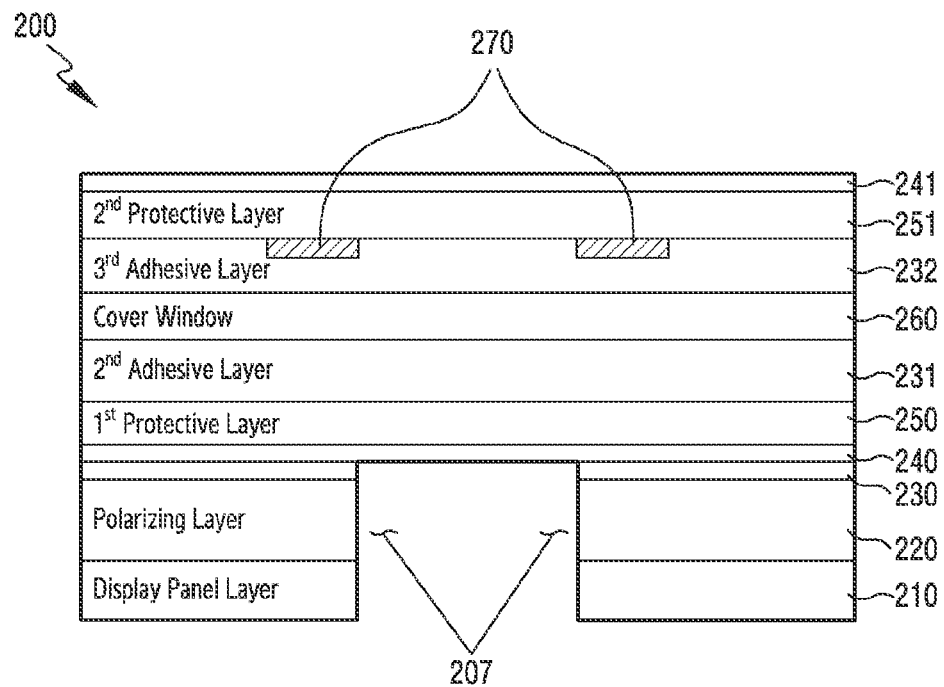
FIG. 2B is a cross-sectional view of a display including a printed pattern taken along line A-A' in FIG. 1A according to various embodiments.

FIG. 2B is a cross-sectional view of the display 200 including the printed pattern 270 taken along line A-A' in FIG. 1A according to various embodiments.

Referring to FIG. 2B, the printed pattern 270 may be disposed on the bottom surface of the second protective layer 251 (e.g., in the −z direction in FIG. 2B). The printed pattern 270 may be disposed at a position corresponding to the opening area 207.

FIG. 2C is a cross-sectional view of the display 200 including the printed pattern 270 taken along line A-A' in FIG. 1A according to various embodiments.

Referring to FIG. 2C, the cover window 260 may be disposed on the top surface of the polarizing layer 220. In an example, the first adhesive layer 230 may be embedded between the polarizing layer 220 and the cover window 260. The cover window 260 may be attached to the polarizing layer 220 via the first adhesive layer 230.

Figure 3:
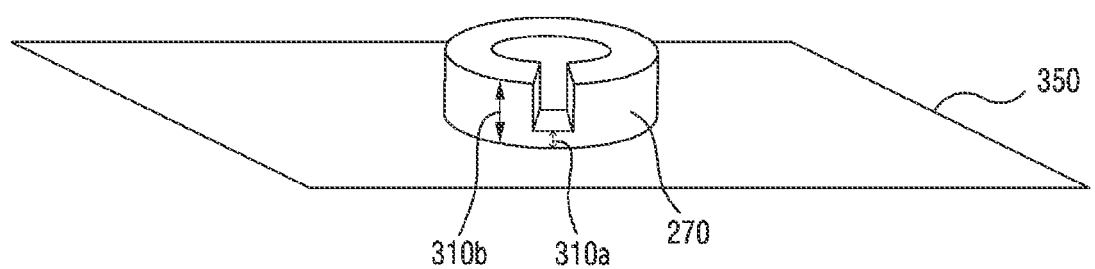
FIG. 3 is a perspective view illustrating a printed pattern and a layer on which the printed pattern is disposed according to various embodiments.

FIG. 3 is a perspective view illustrating a printed pattern 270 and a first layer 350 on which the printed pattern 270 is disposed according to various embodiments. For example, the first layer 350 may be a first protective layer (e.g., the first protective layer 250 in FIG. 2A). In another example, the first layer 350 may correspond to either a second protective layer (e.g., the second protective layer 251 in FIG. 2A) or a cover window (e.g., the cover window 260 in FIG. 2A).

Referring to FIG. 3, a ring-shaped printed pattern 270 may be disposed on the first layer 350 that does not include the opening area 207. In an example, when the first layer 350 is the first protective layer 250, the printed pattern 270 may be disposed on the top surface of the first protective layer 250. In an example, when the first layer 350 is the second protective layer 251 or the cover window 260, the printed pattern 270 may be disposed on the bottom surface of the second protective layer 251 or the cover window 260. In an example, the printed pattern 270 may be disposed to correspond to the opening area 207.

In an embodiment, the printed pattern 270 blocks the light emitted from the display panel layer 210 so that the optical sensor disposed in at least a portion of the opening area 207 cannot be affected by the light emitted from the display panel layer 210. In addition, the printed pattern 270 may prevent and/or reduce the emitted light from being observed outside.

In an embodiment, the printed pattern 270 may include a plurality of ink-printed layers. In an example, a portion of the printed pattern 270 including a plurality of ink-printed layers may have a first height 310a, and the remaining portion may have a second height 310b higher than the first height 310a. In an example, the printed pattern 270 may include a step formed by areas having different heights. In an example, at least a portion of the plurality of ink-printed layers having the first height 310a in the printed pattern 270 including the step may be removed.

In an embodiment, the printed pattern 270 may be implemented to have a black color.

In an embodiment, the printed pattern 270 may be disposed to correspond to the opening area 207 and surround the opening area 207. By making the printed pattern 270 surround the opening area 207, it is possible to prevent and/or reduce boundary lines or gaps between the optical sensor disposed in at least a portion of the opening area 207 and the plurality of panels of the display 200 from being visible.

In an embodiment, the second height 310b of the printed pattern 270 may be lower than the height of adhesive layers (e.g., the adhesive layers 230, 231, and 232 in FIG. 2A) disposed on the surface on which the printed pattern 270 of the first layer 350 is disposed.

In an embodiment, since a portion of the ring shape of the printed pattern 270 has a first height 310a, and the remaining portion of the ring shape has a second height 310b, the printed pattern 270 may include a step having a height corresponding to the difference between the first height 310a and the second height 310b. In an example, since the highly flexible fluid of the adhesive layers (e.g., the adhesive layers 230, 231, 232 of FIG. 2A) laminated on the surface on which the printed pattern 270 is movable through the step, the flatness of the display 200 can be improved. For example, when the printed pattern 270 is disposed on the top surface (e.g., the +z direction in FIG. 2A) of the first protective layer 250 corresponding to the opening area 207, the second adhesive layer 231 embedded between the first protective layer 250 and the cover window 260 may cover the printed pattern 270. In an embodiment, the second adhesive layer 231 is a highly flexible fluid, and is movable through the step formed in the printed pattern 270 disposed on the top surface (e.g., the +z direction in FIG. 2A) of the first protective layer 250. Accordingly, the degree to which flatness is reduced due to the arrangement of the printed pattern 270 can be suppressed. In addition, the reduction in flatness, which is a measure of image quality improvement, due to the arrangement of the printed pattern 270 can be suppressed. In an example, the optical uniformity of an image and/or a moving picture acquired by the optical sensor can be improved according to the arrangement of the printed pattern 270. It is possible to address the problem of local image quality deterioration of an image and/or a moving picture acquired by the optical sensor disposed in the opening area 207 due to the reduction in flatness of the printed pattern 270.

In an embodiment, the printed pattern 270 may be implemented in a manner of printing the pattern. For example, it is possible to make a portion, other than the area having the first height 310a, have the second height 310b by primarily printing a first pattern including a closed curve having the first height 310a and printing a second pattern having a shape in which a portion of the closed curve is removed on the first pattern multiple times.

FIG. 4A is a diagram illustrating flatness measurement data values of a display 200 including a printed pattern 410 having a first height 410a, and FIG. 4B is a diagram illustrating flatness measurement data values of a display including a printed pattern 420 having a second height 420a according to various embodiments.

Referring to FIG. 4A, flatness measurement data values of a display 200 including a ring-shaped printed pattern 410 having a first height 410a and a display 200 including a ring-shaped printed pattern 410 having a first height 410a of the prior art are shown. In an example, the first height may be about 5 μm. In this case, a peak-to-valley (PV) value indicating the flatness of the printed pattern 410 may be about 0.54 μm.

Referring to FIG. 4B, flatness measurement data values of a display 200 including a ring-shaped printed pattern 420 having a second height 420a and a display 200 including a ring-shaped printed pattern 420 having a second first height 420a of the prior art are shown. In an example, the second height may be about 2 µm. In this case, the PV value indicating the flatness of the printed pattern 420 may be about 0.25 µm.

Referring to FIGS. 4A and 4B, in an example, the PV value of the display 200 including the printed pattern 420 having the second height 420a of about 2 µm is smaller than the PV value of the display 200 including the printed pattern 410 having the first height 410a of about 5 µm by about 0.29 µm. Thus, the former may be better than the latter in terms of flatness. A display including a high printed pattern may have poor flatness. In an example of the prior art, the height of the printed pattern 420 having the second height 420a of about 2 µm is lower than the height of the printed pattern 410 having the first height 410a of about 5 µm. Thus, when the user views the printed pattern from the outside, the printed pattern 420 having the second height 420a of about 2 µm may look thinner than the printed pattern 410 having the first height 410a of about 5 µm. When the printed pattern having a relatively low height is included in the electronic device, a boundary line between the plurality of panels of the display and the optical sensor may be visible from the outside, and thus the appearance of the display may be relatively poor.

FIG. 4C is a diagram illustrating flatness measurement data values of a display 200 including the printed pattern 270 of FIG. 3 according to various embodiments.

Referring to FIG. 4C, a flatness graph and flatness measurement data of a display 200 including a printed pattern 270 in which a portion of the ring shape has a first height 310a and the remaining portion of the ring shape has a second height 310b can be seen. In an example, the first height 310a may be lower than the second height 310b. For example, the first height 310a may be about 2 µm. The second height 310b may be about 5 µm. In this case, the printed pattern 270 may include a step having a height corresponding to the difference between the first height 310a and the second height 310b. The highly flexible adhesive material of adhesive layers (e.g., the adhesive layers 230, 231, and 232 in FIG. 2A) may move through the step formed in the printed pattern 270.

In an embodiment, a printed pattern 270 in which a portion of the ring shape has the first height 310a of about 2 µm and the remaining portion of the ring shape has the second height 310b of about 5 be disposed in an area corresponding to the opening area 207 in the upper portion (e.g., the +z direction in FIG. 2A) of the first protective layer 250. In an example, the second adhesive layer 231 may cover the printed pattern 270. In an example, the highly flexible fluid forming the second adhesive layer 231 may move through the step in the printed pattern 270. For example, the highly flexible fluid forming the second adhesive layer 231 filling a hole perforated in the printed pattern 270 may move through the step in the printed pattern 270, or a high flexible fluid forming the second adhesive layer 231 in the other area may move to a hole perforated in the center through the step in the printed pattern 270.

Referring to FIG. 4C, a flatness graph and flatness measurement data of a display 200 including a printed pattern 270 in which a portion of the ring shape has a first height 310a and the remaining portion of the ring shape has a second height 310b can be seen. In an example, the first height 310a may be about 2 µm. The second height 130b may be about 5 µm. In this case, the PV value indicating the flatness of the printed pattern 270 may be about 0.20 µm.

In an embodiment, the second adhesive layer 231 may cover the printed pattern 270 and fill a hole perforated in the printed pattern 270. In an example, the highly flexible fluid forming the second adhesive layer 231 may move through the step so that the flatness of the display 200 can be improved.

In an example, the display 200 including the printed pattern 270 in which a portion of the ring shape has the first height 310a of 2 µm and the remaining portion of the ring shape has the second height 310b of 5 µm has a height higher than that of the display including the printed pattern 420 having a second height 420a of about 2 µm corresponding to the prior art. Therefore, the display 200 can be improved in terms of the aesthetics as well as the flatness. In an example, in the display 200 including the printed pattern 270 in which a portion of the ring shape has the first height 310a of about 2 µm and the remaining portion of the ring shape has the second height 310b of 5 µm, the fluid of the second adhesive layer 231 may be disposed in the passageway of the printed pattern 270. Thus, the display can be improved in terms of flatness than a display including the printed pattern 410 and a display including the printed pattern 420 corresponding to the prior art. That is, compared with a display including a printed pattern of the prior art (e.g., the printed pattern 410 in FIG. 4B or the printed pattern 420 in FIG. 4A), the display 200 including the printed pattern 270 can be improved in terms of flatness, which is a measure of improvement of the aesthetics and image quality seen from the outside. Accordingly, optical uniformity related to image quality of an image and/or a moving picture acquired by the optical sensor disposed in the opening area 207 can be improved. That is, it is possible to solve a problem of local image quality deterioration that may occur in an image and/or a moving picture acquired by the optical sensor according to the improvement of the flatness.

Figure 5A:
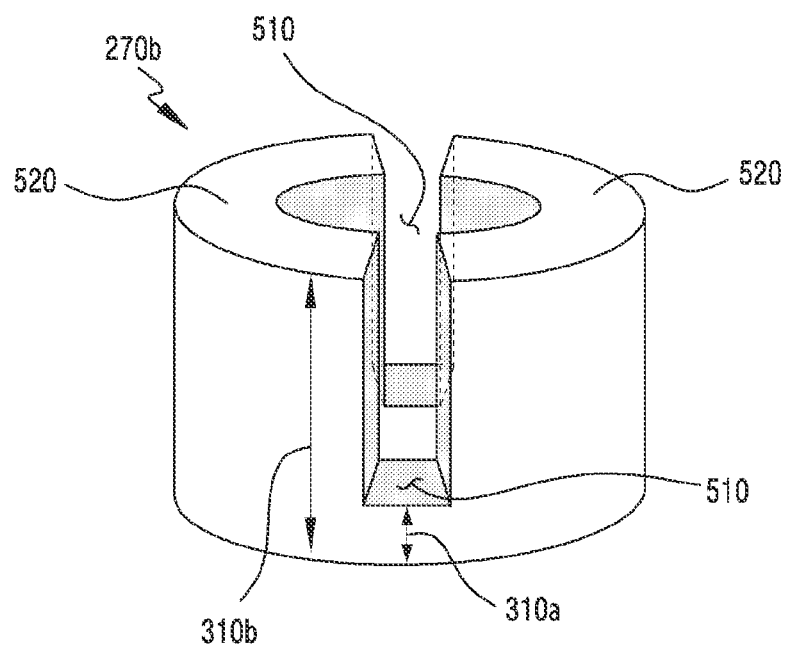
FIG. 5A is a perspective view illustrating a printed pattern according to various embodiments.

FIG. 5A is a perspective view illustrating a printed pattern 270b according to various embodiments.

Referring to FIG. 5A, the printed pattern 270b may include four areas. Among the four areas, two areas may be first areas 510 having a first height 310a, and the remaining two areas may be second areas 520 having a second height 310b.

In an embodiment, the first areas 510 having the first height 310a may have a narrower area than the second areas 520 having the second height 310b. Most of the area of the printed pattern 270b may have the second height 310b, and a portion of the area may have the first height 310a.

In an embodiment, the printed pattern 270b may have a plurality of steps having a height corresponding to the difference between the first height 310a and the second height 310b.

Figure 5B:
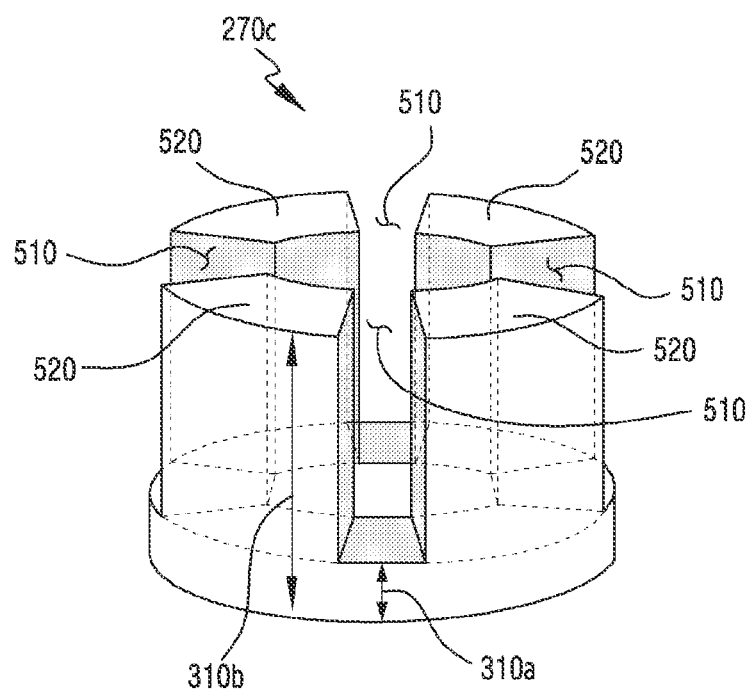
FIG. 5B is a perspective view illustrating a printed pattern according to various embodiments.

FIG. 5B is a perspective view illustrating a printed pattern 270C according to various embodiments.

Referring to FIG. 5B, the printed pattern 270c may include eight areas. Four areas may be first areas 510 having a first height 310a, and the remaining four areas may be second areas 520 having a second height 310b.

In an embodiment, the printed pattern 270c may have four steps having a height corresponding to the difference between the first height 310a and the second height 310b.

Figure 5C:
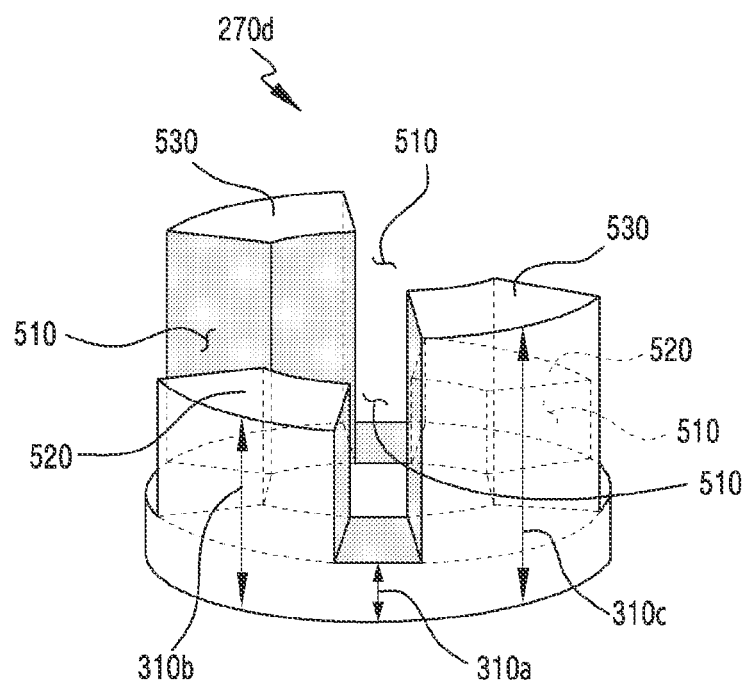
FIG. 5C is a perspective view illustrating a printed pattern according to various embodiments.

FIG. 5C is a perspective view illustrating the printed pattern 270d according to various embodiments.

Referring to FIG. 5C, the printed pattern 270d may include a plurality of areas having different heights.

Referring to FIG. 5C, the printed pattern 270*d* may include eight areas. Among the eight areas, four areas may be first areas 510 having a first height 310*a*, two areas may be second areas 520 having a second height 310*b*, and the remaining two areas may be third areas 530 having a third height 310*c*.

Figure 6A:
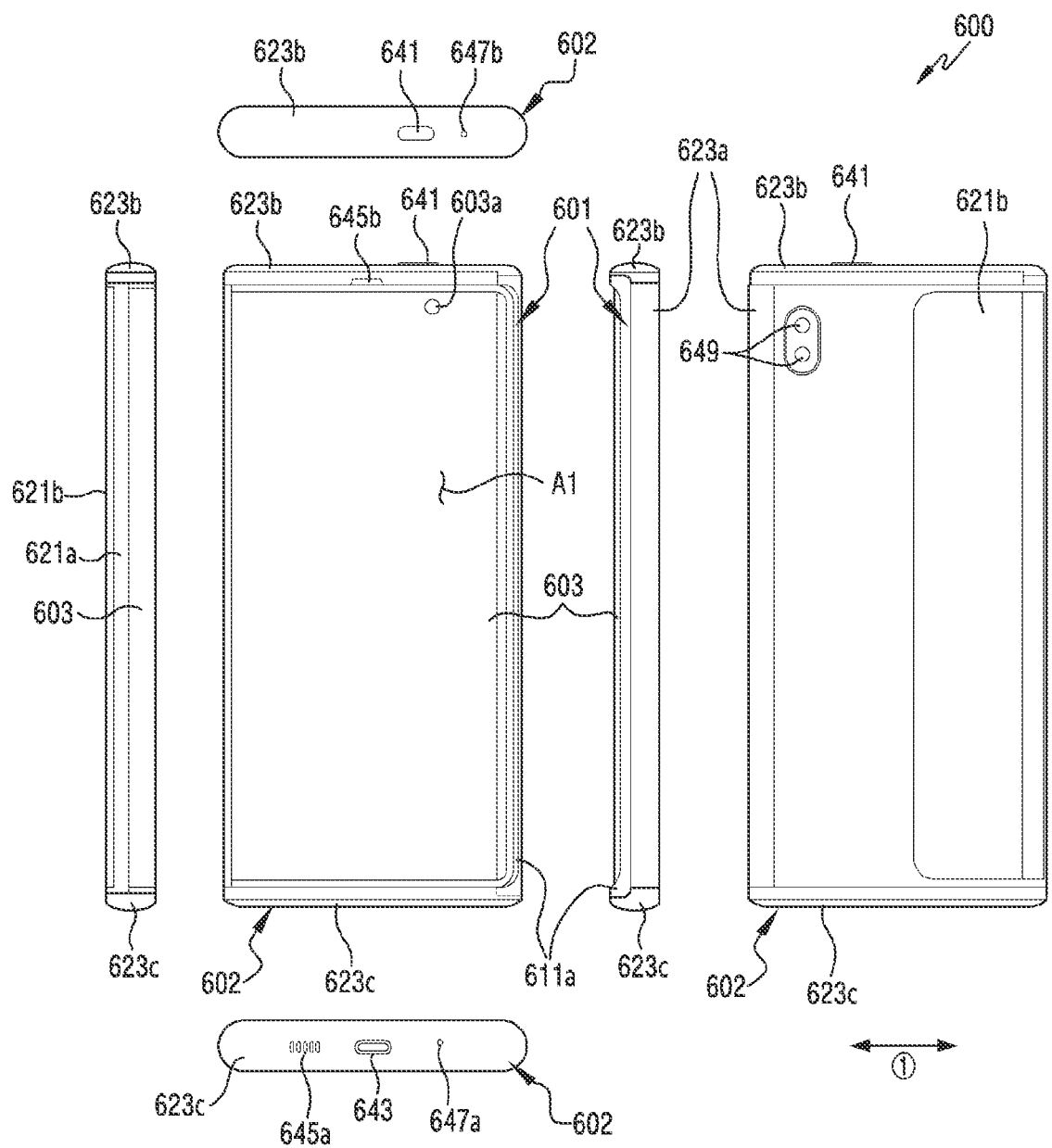
FIG. 6A is a diagram illustrating a state in which a portion of a flexible display is accommodated in a second housing according to various embodiments.
Figure 6B:
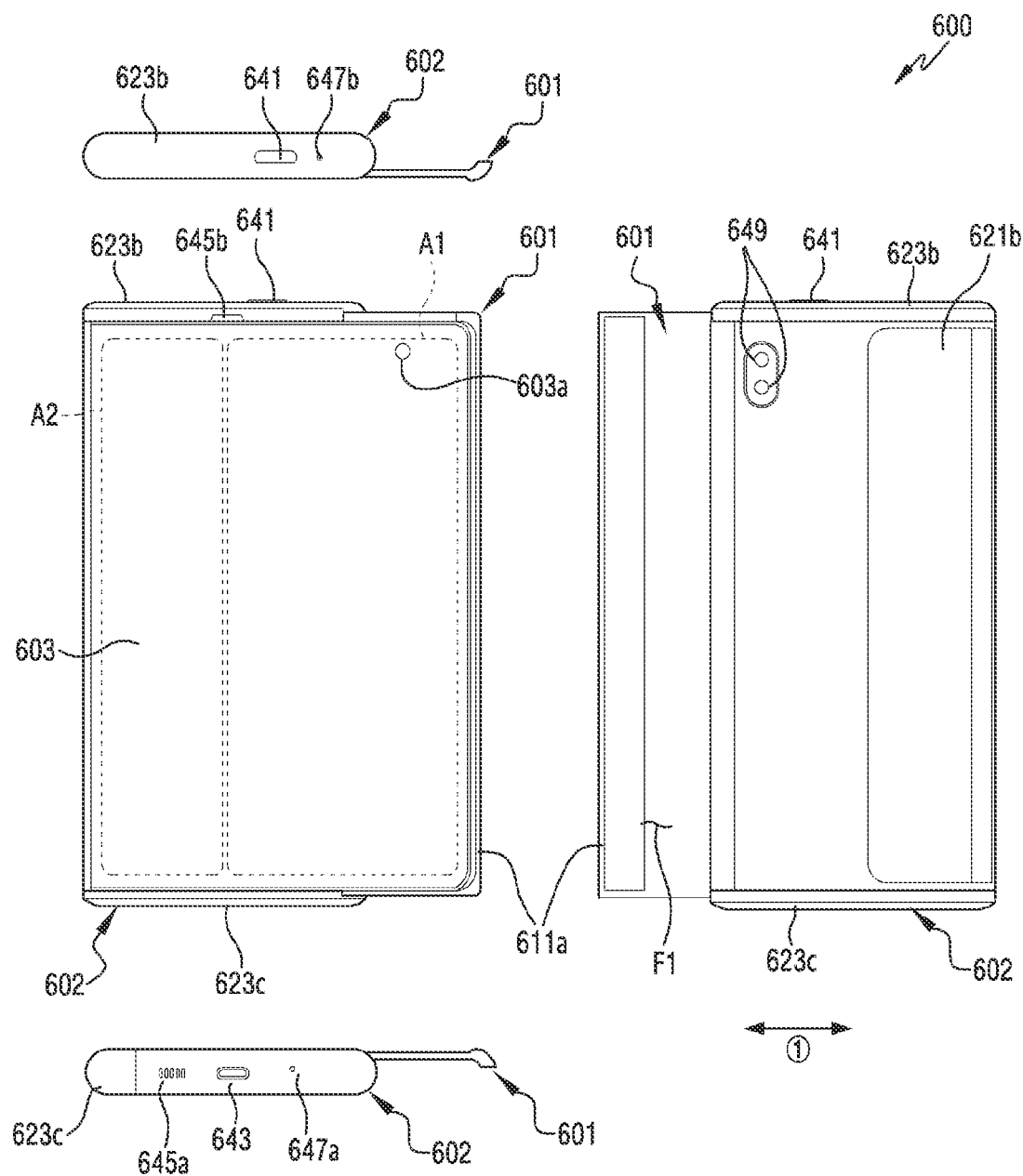
FIG. 6B is a diagram illustrating a state in which most of the flexible display is exposed to the outside of the second housing according to various embodiments.

FIG. 6A is a diagram illustrating a state in which a portion of a display 603 is accommodated in a second housing 602 according to various embodiments. FIG. 6B is a diagram illustrating a state in which most of the display 603 is exposed to the outside of the second housing 602 according to various embodiments.

The configuration of the electronic device 600 of FIGS. 6A and 6B may be all or partly the same as that of the electronic device 101 in FIGS. 1A and 1C.

The state illustrated in FIG. 6A may be defined as the state in which the first housing 601 is closed relative to the second housing 602, and the state illustrated in FIG. 6B may be defined as the state in which the first housing 601 is opened relative to the second housing 602. According to an embodiment, the "closed state" or the "opened state" may be defined as the state in which the electronic device is closed or the state in which the electronic device is opened.

Referring to FIGS. 6A and 6B, the electronic device 600 may include a first housing 601 and a second housing 602 that is movably disposed inside the first housing 601. In various embodiments, the first housing 601 may be interpreted as a structure that is slidably disposed on the second housing 602. According to an embodiment, the first housing 601 may be disposed to be reciprocable by a predetermined distance in the illustrated direction (e.g., the direction indicated by arrow ①) relative to the second housing 602.

According to various embodiments, the first housing 601 may be referred to as, for example, a first structure, a slide unit, or a slide housing, and may be disposed to be reciprocable on the second housing 602. In an embodiment, the second housing 602 may be referred to as, for example, a second structure, a main unit, or a main housing, and may accommodate various electrical and electronic components such as a main circuit board and a battery. A portion of the display 603 (e.g., the first area A1) may be seated on the first housing 601. In various embodiments, when the first housing 601 moves (e.g., slides) relative to the second housing 602, another portion (e.g., the second area A2) of the display 603 may be accommodated inside the second housing 602 (e.g., a slide-in operation) or exposed to the outside of the second housing 602 (e.g., a slide-out operation).

According to various embodiments, the first housing 601 may include a first plate 611*a* (e.g., a slide plate) and may include a first surface F1 including at least a portion of the first plate 611*a*. According to an embodiment, the second housing 602 may include a second plate 621*a* (e.g., a rear case), a first side wall 623*a* extending from the second plate 621*a*, a second side wall 623*b* extending from the first side wall 623*a* and the second plate 621*a*, a third side wall 623*c* extending from the first side wall 623*a* and the second plate 621*a* and parallel to the second side wall 623*b*, and/or a rear plate 621*b* (e.g., a rear window). In various embodiments, the second side wall 623*b* and the third side wall 623*c* may be perpendicular to the first side wall 623*a*. According to an embodiment, the second plate 621*a*, the first side wall 623*a*, the second side wall 623*b*, and the third side wall 623*c* may be opened on one side (e.g., the front surface) to accommodate (or surround) at least a portion of the first housing 601. For example, the first housing 601 may be coupled to the second housing 602 in a state of being at least partially surrounded and is slidable in a direction parallel to the first surface F1 or the second surface F2 (e.g., the direction indicated by arrow ①) while being guided by the second housing 602.

According to various embodiments, the second sidewall 623*b* or the third sidewall 623*c* may be omitted. According to an embodiment, the second plate 621*a*, the first side wall 623*a*, the second side wall 623*b*, and/or the third side wall 623*c* may be configured as separate housings and coupled or assembled to each other. The rear plate 621*b* may be coupled to surround at least a portion of the second plate 621*a*. In various embodiments, the rear plate 621*b* may be substantially integrally configured with the second plate 621*a*. According to an embodiment, the second plate 621*a* or the rear plate 621*b* may cover at least a portion of the display 603. For example, the display 603 may be at least partially accommodated inside the second housing 602, and the second plate 621*a* or the rear plate 621*b* may cover a portion of the flexible display 603 accommodated inside the second housing 602.

According to various embodiments, the first housing 601 is movable to an opened state or a closed state relative to the second housing 602 in a direction (e.g., the direction ①) parallel to the second plate 621*a* (e.g., the rear case) and the second sidewall 623*b* such that the first housing 601 is located at a first distance from the first side wall 623*a* in the closed state and at a second distance, which is greater than the first distance, from the first side wall 623*a* in the opened state. In various embodiments, in the closed state, the first housing 601 may be positioned to surround a portion of the first side wall 623*a*.

According to various embodiments, the electronic device 600 may include at least one of a display 603, a key input device 641, a connector hole 643, audio modules 645*a*, 645*b*, 647*a*, and 647*b*, or a camera module 649. Although not illustrated, the electronic device 600 may further include an indicator (e.g., an LED device) or various sensor modules.

According to various embodiments, the display 603 may include a first area A1 and a second area A2. In an embodiment, the first area A1 may extend substantially across at least a portion of the first surface F1 to be disposed on the first housing surface F1. The second area A2 extends from the first area A1 and may be inserted or accommodated into the second housing 602 (according to the sliding movement of the first housing 601, or may be exposed to the outside of the second housing 602. As will be described later, the second area A2 is moved while being guided substantially by a roller mounted on the second housing 602 to be accommodated inside the second housing 602 or exposed outside the second housing 602. For example, while the first housing 601 slides, a portion of the second area A2 may be deformed into a curved shape at a position corresponding to the roller.

According to various embodiments, the display 603 may include an opening area 603*a*. A plurality of optical sensors (e.g., a sensor module and/or a camera module) may be disposed in at least one area of the opening area 603*a*.

According to various embodiments, when viewed from above the first plate 611*a* (e.g., the slide plate), if the first housing 601 moves from the closed state to the opened state, the second area A2 may define a substantially flat surface with the first area A1 while being gradually exposed outside the second housing 602. The display 603 may be coupled to or disposed adjacent to a touch-sensitive circuit, a pressure sensor capable of measuring a touch intensity (pressure), and/or a digitizer configured to detect a magnetic-field-type stylus pen. In an embodiment, the second area A2 may be at least partially accommodated inside the second housing 602, and a portion of the second area A2 may also be exposed to the outside even in the state illustrated in FIG. 6A (e.g., the closed state). In various embodiments, irrespective of the closed state or the opened state, a portion of the exposed second area A2 may be located on the roller, and at a position corresponding to the roller, a portion of the second area A2 may maintain a curved shape.

The key input device 641 may be disposed on the second side wall 623b or the third side wall 623c of the second housing 602. Depending on the external appearance and use state, the electronic device 600 may be designed such that the illustrated key input devices 641 are omitted or an additional key input device(s) is (are) included. In some embodiment, the electronic device 600 may include a key input device (not illustrated), such as a home key button or a touch pad disposed around the home key button. According to an embodiment, at least a portion of the key input device 641 may be located in one area of the first housing 601.

According to various embodiments, the connector hole 643 may be omitted depending on an embodiment, and may accommodate a connector (e.g., a USB connector) for transmitting and receiving power and/or data to and from an external electronic device. Although not illustrated, the electronic device 600 may include a plurality of connector holes 643, and some of the connector holes 643 may function as connector holes for transmitting and receiving audio signals to and from an external electronic device. In the illustrated embodiment, the connector hole 643 is disposed in the third side wall 623c, but the disclosure is not limited thereto. The connector hole 643 or a connector hole (not illustrated) may be disposed in the first side wall 623a or the second side wall 623b.

According to various embodiments, the audio modules 645a, 645b, 647a, and 647b may include speaker holes 645a and 645b or microphone holes 647a and 647b. One of the speaker holes 645a and 645b may be provided as a receiver hole for a voice call, and another one may be provided as an external speaker hole. The microphone holes 647a and 647b may include a microphone disposed therein so as to acquire external sound and, in various embodiments, may include multiple microphones disposed therein so as to sense the direction of sound. In various embodiments, the speaker holes 645a and 645b and the microphone holes 647a and 647b may be implemented as a single hole, or a speaker may be included without the speaker holes 645a and 645b (e.g., a piezo speaker). According to an embodiment, the speaker hole indicated by reference numeral "645b" may be disposed in the first housing 601 to be utilized as a receiver hole for a voice call, and the speaker hole (e.g., an external speaker hole) indicated by reference numeral "645a" or the microphone holes 647a and 647b may be disposed in the second housing 602 (e.g., one of the side surfaces 623a, 623b, and 623c).

The camera module 649 may be provided in the second housing 602 and may photograph a subject in a direction opposite to the first area A1 of the display 603. The electronic device 600 may include a plurality of camera modules 649. For example, the electronic device 600 may include a wide-angle camera, a telephoto camera, or a close-up camera, and according to an embodiment, may measure a distance to a subject by including an infrared projector and/or an infrared receiver. The camera module 649 may include one or more lenses, an image sensor, and/or an image signal processor. Although not illustrated, the electronic device 600 may further include a camera module (e.g., a front camera) for photographing a subject in a direction opposite to the first area A1 of the display 603. For example, the front camera may be disposed around the first area A1 or in an area overlapping the display 603, and when disposed in the region overlapping the display 603, the front camera may photograph a subject through the display 603.

According to various embodiments, an indicator (not illustrated) of the electronic device 600 may be disposed on the first housing 601 or the second housing 602 and may provide state information of the electronic device 600 as a visual signal by including a light-emitting diode. A sensor module (not illustrated) of the electronic device 600 may generate an electrical signal or a data value corresponding to an internal operating state of the electronic device 600 or an external environmental state. The sensor module may include, for example, a proximity sensor, a fingerprint sensor, or a biometric sensor (e.g., an iris/face recognition sensor or an HRM sensor). In an embodiment, the sensor module may further include at least one of, for example, a gesture sensor, a gyro sensor, an atmospheric pressure sensor, a magnetic sensor, an acceleration sensor, a grip sensor, a color sensor, an infrared (IR) sensor, a temperature sensor, a humidity sensor, or an illuminance sensor.

Figure 7:
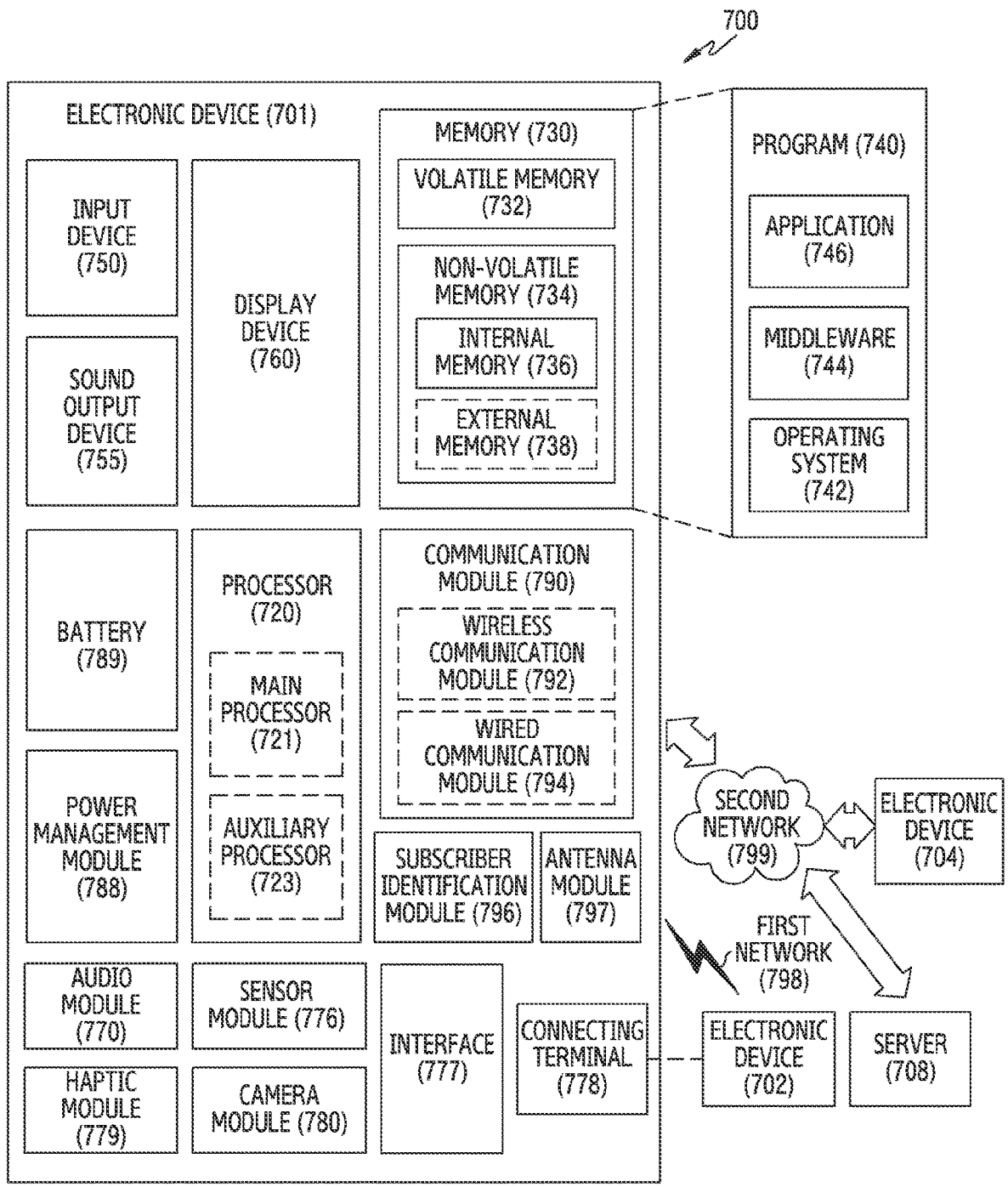
FIG. 7 is a block diagram illustrating an example electronic device in a network environment according to various embodiments.

FIG. 7 is a block diagram illustrating an example electronic device 701 in a network environment 700 according to various embodiments.

Referring to FIG. 7, the electronic device 701 in the network environment 700 may communicate with an electronic device 702 via a first network 798 (e.g., a short-range wireless communication network), or at least one of an electronic device 704 or a server 708 via a second network 799 (e.g., a long-range wireless communication network). According to an embodiment, the electronic device 701 may communicate with the electronic device 704 via the server 708. According to an embodiment, the electronic device 701 may include a processor 720, memory 730, an input module 750, a sound output module 755, a display module 760, an audio module 770, a sensor module 776, an interface 777, a connecting terminal 778, a haptic module 779, a camera module 780, a power management module 788, a battery 789, a communication module 790, a subscriber identification module (SIM) 796, or an antenna module 797. In various embodiments, at least one of the components (e.g., the connecting terminal 778) may be omitted from the electronic device 701, or one or more other components may be added in the electronic device 701. In various embodiments, some of the components (e.g., the sensor module 776, the camera module 780, or the antenna module 797) may be implemented as a single component (e.g., the display module 760).

The processor 720 may execute, for example, software (e.g., a program 740) to control at least one other component (e.g., a hardware or software component) of the electronic device 701 coupled with the processor 720, and may perform various data processing or computation. According to an embodiment, as at least part of the data processing or computation, the processor 720 may store a command or data received from another component (e.g., the sensor module 776 or the communication module 790) in volatile memory 732, process the command or the data stored in the volatile memory 732, and store resulting data in non-volatile memory 734. According to an embodiment, the processor 720 may include a main processor 721 (e.g., a central processing unit (CPU) or an application processor (AP)), or an auxiliary processor 723 (e.g., a graphics processing unit (GPU), a neural processing unit (NPU), an image signal processor (ISP), a sensor hub processor, or a communication processor (CP)) that is operable independently from, or in conjunction with, the main processor 721. For example, when the electronic device 701 includes the main processor 721 and the auxiliary processor 723, the auxiliary processor 723 may be adapted to consume less power than the main processor 721, or to be specific to a specified function. The auxiliary processor 723 may be implemented as separate from, or as part of the main processor 721.

The auxiliary processor 723 may control at least some of functions or states related to at least one component (e.g., the display module 760, the sensor module 776, or the communication module 790) among the components of the electronic device 701, instead of the main processor 721 while the main processor 721 is in an inactive (e.g., sleep) state, or together with the main processor 721 while the main processor 721 is in an active state (e.g., executing an application). According to an embodiment, the auxiliary processor 723 (e.g., an image signal processor or a communication processor) may be implemented as part of another component (e.g., the camera module 780 or the communication module 790) functionally related to the auxiliary processor 723. According to an embodiment, the auxiliary processor 723 (e.g., the neural processing unit) may include a hardware structure specified for artificial intelligence model processing. An artificial intelligence model may be generated by machine learning. Such learning may be performed, e.g., by the electronic device 701 where the artificial intelligence is performed or via a separate server (e.g., the server 708). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 730 may store various data used by at least one component (e.g., the processor 720 or the sensor module 776) of the electronic device 701. The various data may include, for example, software (e.g., the program 740) and input data or output data for a command related thereto. The memory 730 may include the volatile memory 732 or the non-volatile memory 734.

The program 740 may be stored in the memory 730 as software, and may include, for example, an operating system (OS) 742, middleware 744, or an application 746.

The input module 750 may receive a command or data to be used by another component (e.g., the processor 720) of the electronic device 701, from the outside (e.g., a user) of the electronic device 701. The input module 750 may include, for example, a microphone, a mouse, a keyboard, a key (e.g., a button), or a digital pen (e.g., a stylus pen).

The sound output module 755 may output sound signals to the outside of the electronic device 701. The sound output module 755 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 760 may visually provide information to the outside (e.g., a user) of the electronic device 701.

The display module 760 may include, for example, a display, a hologram device, or a projector and control circuitry to control a corresponding one of the display, hologram device, and projector. According to an embodiment, the display module 760 may include a touch sensor adapted to detect a touch, or a pressure sensor adapted to measure the intensity of force incurred by the touch.

The audio module 770 may convert a sound into an electrical signal and vice versa. According to an embodiment, the audio module 770 may obtain the sound via the input module 750, or output the sound via the sound output module 755 or a headphone of an external electronic device (e.g., an electronic device 702) directly (e.g., wiredly) or wirelessly coupled with the electronic device 701.

The sensor module 776 may detect an operational state (e.g., power or temperature) of the electronic device 701 or an environmental state (e.g., a state of a user) external to the electronic device 701, and then generate an electrical signal or data value corresponding to the detected state. According to an embodiment, the sensor module 776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 777 may support one or more specified protocols to be used for the electronic device 701 to be coupled with the external electronic device (e.g., the electronic device 702) directly (e.g., wiredly) or wirelessly. According to an embodiment, the interface 777 may include, for example, a high definition multimedia interface (HDMI), a universal serial bus (USB) interface, a secure digital (SD) card interface, or an audio interface.

A connecting terminal 778 may include a connector via which the electronic device 701 may be physically connected with the external electronic device (e.g., the electronic device 702). According to an embodiment, the connecting terminal 778 may include, for example, a HDMI connector, a USB connector, a SD card connector, or an audio connector (e.g., a headphone connector).

The haptic module 779 may convert an electrical signal into a mechanical stimulus (e.g., a vibration or a movement) or electrical stimulus which may be recognized by a user via his tactile sensation or kinesthetic sensation. According to an embodiment, the haptic module 779 may include, for example, a motor, a piezoelectric element, or an electric stimulator.

The camera module 780 may capture a still image or moving images. According to an embodiment, the camera module 780 may include one or more lenses, image sensors, image signal processors, or flashes.

The power management module 788 may manage power supplied to the electronic device 701. According to an embodiment, the power management module 788 may be implemented as at least part of, for example, a power management integrated circuit (PMIC).

The battery 789 may supply power to at least one component of the electronic device 701. According to an embodiment, the battery 789 may include, for example, a primary cell which is not rechargeable, a secondary cell which is rechargeable, or a fuel cell.

The communication module 790 may support establishing a direct (e.g., wired) communication channel or a wireless communication channel between the electronic device 701 and the external electronic device (e.g., the electronic device 702, the electronic device 704, or the server 708) and performing communication via the established communication channel. The communication module 790 may include one or more communication processors that are operable independently from the processor 720 (e.g., the application processor (AP)) and supports a direct (e.g., wired) communication or a wireless communication. According to an embodiment, the communication module 790 may include a wireless communication module 792 (e.g., a cellular communication module, a short-range wireless communication module, or a global navigation satellite system (GNSS) communication module) or a wired communication module 794 (e.g., a local area network (LAN) communication module or a power line communication (PLC) module). A corresponding one of these communication modules may communicate with the external electronic device via the first network 798 (e.g., a short-range communication network, such as Bluetooth™, wireless-fidelity (Wi-Fi) direct, or infrared data association (IrDA)) or the second network 799 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 792 may identify and authenticate the electronic device 701 in a communication network, such as the first network 798 or the second network 799, using subscriber information (e.g., international mobile subscriber identity (IMSI)) stored in the subscriber identification module 796.

The wireless communication module 792 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 792 may support a high-frequency band (e.g., the mmWave band) to achieve, e.g., a high data transmission rate. The wireless communication module 792 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 792 may support various requirements specified in the electronic device 701, an external electronic device (e.g., the electronic device 704), or a network system (e.g., the second network 799). According to an embodiment, the wireless communication module 792 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 797 may transmit or receive a signal or power to or from the outside (e.g., the external electronic device) of the electronic device 701. According to an embodiment, the antenna module 797 may include an antenna including a radiating element including a conductive material or a conductive pattern formed in or on a substrate (e.g., a printed circuit board (PCB)). According to an embodiment, the antenna module 797 may include a plurality of antennas (e.g., array antennas). In such a case, at least one antenna appropriate for a communication scheme used in the communication network, such as the first network 798 or the second network 799, may be selected, for example, by the communication module 790 (e.g., the wireless communication module 792) from the plurality of antennas. The signal or the power may then be transmitted or received between the communication module 790 and the external electronic device via the selected at least one antenna. According to an embodiment, another component (e.g., a radio frequency integrated circuit (RFIC)) other than the radiating element may be additionally formed as part of the antenna module 797.

According to various embodiments, the antenna module 797 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 701 and the external electronic device 704 via the server 708 coupled with the second network 799. Each of the electronic devices 702 or 704 may be a device of a same type as, or a different type, from the electronic device 701. According to an embodiment, all or some of operations to be executed at the electronic device 701 may be executed at one or more of the external electronic devices 702, 704, or 708. For example, if the electronic device 701 should perform a function or a service automatically, or in response to a request from a user or another device, the electronic device 701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 701. The electronic device 701 may provide the outcome, with or without further processing of the outcome, as at least part of a reply to the request. To that end, a cloud computing, distributed computing, mobile edge computing (MEC), or client-server computing technology may be used, for example. The electronic device 701 may provide ultra low-latency services using, e.g., distributed computing or mobile edge computing. In an embodiment, the external electronic device 704 may include an internet-of-things (IoT) device. The server 708 may be an intelligent server using machine learning and/or a neural network. According to an embodiment, the external electronic device 704 or the server 708 may be included in the second network 799. The electronic device 701 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various example embodiments of the disclosure, an electronic device may include: a housing, a display viewable to an outside of the electronic device, wherein the display includes a plurality of layers at least one of which includes an opening area, an optical sensor at least a portion of which is disposed in the opening area, and a printed pattern disposed to correspond to the opening area and having a ring shape, wherein the printed pattern may be disposed on a top surface or a bottom surface of a first layer that does not include the opening area among the plurality of layers, and wherein a portion of the ring shape may have a first height, and a remaining portion of the ring shape may have a second height higher than the first height.

In an example embodiment, the first layer of the display may include at least one protective layer, and the printed pattern may be disposed on a top surface or a bottom surface of at least one layer of the protective layer.

In an example embodiment, the plurality of layers of the display may include a display panel layer, and at least one of the display panel layer and the plurality of layers may include an opening area.

In an example embodiment, the plurality of layers including the opening area may include at least one of a polarizing layer, a protective layer, or an adhesive layer.

In an example embodiment, the optical sensor may include an image sensor.

In an example embodiment, the optical sensor may include at least one of a proximity sensor, an illuminance sensor, or a biometric sensor.

In an example embodiment, an adhesive layer may be disposed on one surface on which the printed pattern is disposed.

In an example embodiment, the second height of the printed pattern may be lower than a height of the adhesive layer.

In an example embodiment, the adhesive layer may include an optically clear adhesive (OCA).

In an example embodiment, a cover window may be disposed on at least one of a top surface or a bottom surface of the adhesive layer.

In an example embodiment, the cover window may include at least one of ultra-thin glass (UTG) or colorless polyimide (CPI).

In an example embodiment, the printed pattern may include a closed curve of an ellipse.

In an example embodiment, the printed pattern may include a plurality of areas having the first height.

In an example embodiment, in the printed pattern, a first area having the first height may be narrower than a second area having the second height.

In an example embodiment, the printed pattern may include to an opaque black color.

According to various example embodiments, a display device may include: a layer structure including a plurality of layers, wherein at least one of the plurality of layers includes an opening area, an optical sensor disposed in at least a portion of the opening area, and a printed pattern disposed to correspond to the opening area and having a ring shape, wherein the printed pattern is disposed on a top surface or a bottom surface of a first layer that does not include the opening area among the plurality of layers, and wherein a portion of the ring shape may have a first height, and a remaining portion of the ring shape has a second height higher than the first height.

In an example embodiment, the first layer of the display may include at least one protective layer, and the printed pattern may be disposed on a top surface or a bottom surface of at least one protective layer.

In an example embodiment, the plurality of layers may include a polarizing layer, and at least one of the polarizing layer and the plurality of layers may include an opening area.

In an example embodiment, the printed pattern may include a plurality of areas having the first height.

In an example embodiment, an adhesive layer may be disposed on one surface of the first layer on which the printed pattern is disposed.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
a housing;
a display including a plurality of layers at least one of which includes an opening area;
an optical sensor at least a portion of which is disposed in the opening area; and
a printed pattern disposed to correspond to the opening area and having a ring shape,
wherein the printed pattern is disposed on a top surface or a bottom surface of a first layer that does not include the opening area among the plurality of layers, and
wherein a portion of the ring shape has a first height, and a remaining portion of the ring shape has a second height higher than the first height.

2. The electronic device of claim 1, wherein the first layer of the display includes at least one protective layer, and the printed pattern is disposed on a top surface or a bottom surface of the at least one protective layer.

3. The electronic device of claim 1, wherein the plurality of layers of the display include a display panel layer, and at least one of the display panel layer and the plurality of layers includes an opening area.

4. The electronic device of claim 3, wherein the plurality of layers including the opening area include at least one of a polarizing layer, a protective layer, or an adhesive layer.

5. The electronic device of claim 1, wherein the optical sensor includes an image sensor.

6. The electronic device of claim 1, wherein the optical sensor includes at least one of a proximity sensor, an illuminance sensor, or a biometric sensor.

7. The electronic device of claim 1, wherein an adhesive layer is disposed on one surface on which the printed pattern is disposed.

8. The electronic device of claim 7, wherein the second height of the printed pattern is lower than a height of the adhesive layer.

9. The electronic device of claim 7, wherein the adhesive layer includes an optically clear adhesive (OCA).

10. The electronic device of claim 7, wherein a cover window is disposed on at least one of a top surface or a bottom surface of the adhesive layer.

11. The electronic device of claim 10, wherein the cover window includes at least one of ultra-thin glass (UTG) or colorless polyimide (CPI).

12. The electronic device of claim 1, wherein the printed pattern includes a closed curve of an ellipse.

13. The electronic device of claim 1, wherein the printed pattern includes a plurality of areas having the first height.

14. The electronic device of claim 1, wherein, in the printed pattern, a first area having the first height is narrower than a second area having the second height.

15. The electronic device of claim 1, wherein the printed pattern includes an opaque black color.

16. A display device comprising:
a layer structure including a plurality of layers, wherein at least one of the plurality of layers includes an opening area;
an optical sensor disposed in at least a portion of the opening area; and
a printed pattern disposed to correspond to the opening area and having a ring shape,
wherein the printed pattern is disposed on a top surface or a bottom surface of a first layer that does not include the opening area among the plurality of layers, and
wherein a portion of the ring shape has a first height, and a remaining portion of the ring shape has a second height higher than the first height.

17. The display device of claim 16, wherein the first layer of the layer structure includes at least one protective layer, and the printed pattern is disposed on a top surface or a bottom surface of at least one protective layer.

18. The display device of claim 16, wherein the plurality of layers includes a polarizing layer, and
at least one of the polarizing layer and the plurality of layers includes an opening area.

19. The display device of claim 16, wherein the printed pattern includes a plurality of areas having the first height.

20. The display device of claim 16, wherein an adhesive layer is disposed on one surface of the first layer on which the printed pattern is disposed.

* * * * *